(12) United States Patent
Yamazaki et al.

(10) Patent No.: US 7,192,859 B2
(45) Date of Patent: Mar. 20, 2007

(54) METHOD OF MANUFACTURING SEMICONDUCTOR DEVICE AND DISPLAY DEVICE

(75) Inventors: Shunpei Yamazaki, Tokyo (JP); Toru Takayama, Kanagawa (JP); Tetsuji Yamaguchi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 195 days.

(21) Appl. No.: 10/845,422

(22) Filed: May 13, 2004

(65) Prior Publication Data

US 2005/0026410 A1 Feb. 3, 2005

(30) Foreign Application Priority Data

May 16, 2003 (JP) .............................. 2003-139680

(51) Int. Cl.
*H01L 21/44* (2006.01)
(52) U.S. Cl. .............................. 438/597; 257/E21.507; 257/E21.588; 257/E21.627; 257/E21.641
(58) Field of Classification Search ........ 257/E21.507, 257/E21.588, E21.627, E21.641; 438/597
See application file for complete search history.

(56) References Cited

U.S. PATENT DOCUMENTS

| | | | | |
|---|---|---|---|---|
| 5,132,248 | A | 7/1992 | Drummond et al. ......... | 437/173 |
| 6,294,401 | B1 | 9/2001 | Jacobson et al. ............. | 438/99 |
| 6,362,507 | B1 | 3/2002 | Ogawa et al. ............... | 257/350 |
| 6,514,801 | B1 | 2/2003 | Yudasaka et al. ........... | 438/151 |
| 6,713,389 | B2 | 3/2004 | Speakman .................. | 438/674 |
| 6,794,220 | B2 | 9/2004 | Hirai et al. .................... | 438/99 |
| 6,810,814 | B2* | 11/2004 | Hasei .......................... | 101/485 |
| 6,961,111 | B1* | 11/2005 | Kuramasu ................... | 349/152 |
| 2002/0070382 | A1 | 6/2002 | Yamazaki et al. ............ | 257/72 |
| 2003/0054653 | A1 | 3/2003 | Yamazaki et al. .......... | 438/694 |
| 2003/0059987 | A1 | 3/2003 | Sirringhaus et al. ........ | 438/149 |
| 2003/0083203 | A1 | 5/2003 | Hashimoto et al. ......... | 505/100 |
| 2003/0197754 | A1* | 10/2003 | Nakamura .................... | 347/33 |
| 2004/0147066 | A1 | 7/2004 | Yamazaki et al. .......... | 438/151 |
| 2004/0147113 | A1 | 7/2004 | Yamazaki et al. .......... | 438/660 |
| 2004/0253835 | A1 | 12/2004 | Kawase ....................... | 438/780 |
| 2005/0078158 | A1* | 4/2005 | Magdassi et al. ........... | 347/100 |

(Continued)

FOREIGN PATENT DOCUMENTS

JP 05-338187 12/1993

(Continued)

*Primary Examiner*—Asok Kumar Sarkar
(74) *Attorney, Agent, or Firm*—Cook, Alex, McFarron, Manzo, Cummings & Mehler, Ltd.

(57) ABSTRACT

To provide a method of forming a wiring for the purpose of providing a semiconductor device, which is superior in reliability and cost performance. Further, to provide methods of manufacturing a semiconductor device and a display device by using the method of forming the wiring according to the present invention. According to the present invention, when a wiring material and the like is directly patterned on a substrate mainly having an insulating surface by droplet discharging method, a wiring is formed at a position including at least an opening in contact with an underlying portion on an insulating film provided with the opening by dropping a liquid droplet containing a conductive composition by droplet discharging method. By heating the substrate with the wiring formed thereon, a surface of the wiring on the opening and a surface of the wiring other than the wiring on the opening are approximately leveled, and the opening is filled.

42 Claims, 17 Drawing Sheets

U.S. PATENT DOCUMENTS

| | | | |
|---|---|---|---|
| 2005/0197031 A1 | 9/2005 | Yamazaki et al. | 445/24 |
| 2005/0206313 A1 | 9/2005 | Yamazaki et al. | 313/506 |
| 2005/0208863 A1 | 9/2005 | Yamazaki et al. | 445/24 |
| 2005/0214480 A1* | 9/2005 | Garbar et al. | 428/1.1 |

FOREIGN PATENT DOCUMENTS

| | | |
|---|---|---|
| JP | 06-182980 | 7/1994 |
| JP | 06-237063 | 8/1994 |
| JP | 10-270843 | 10/1998 |
| JP | 2001-052864 | 2/2001 |
| JP | 2002-324966 | 11/2002 |
| JP | 2002-359246 | 12/2002 |
| JP | 2003-133691 | 5/2003 |

* cited by examiner

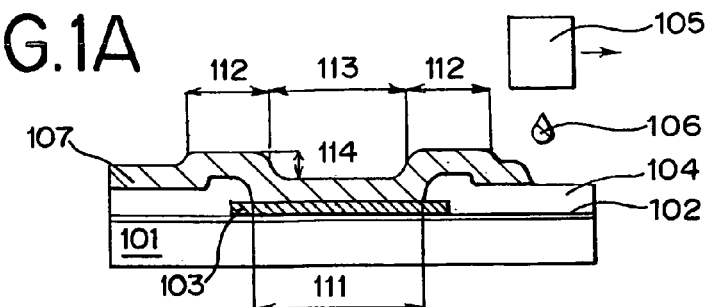
FIG.1A
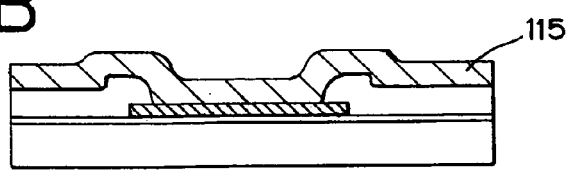
FIG.1B
FIG.1C
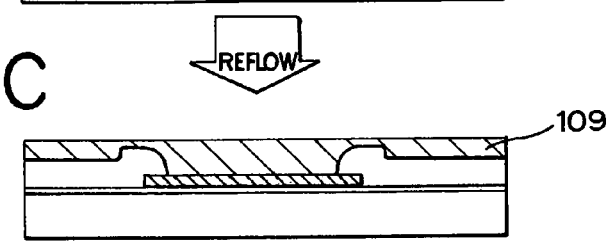
FIG.1D
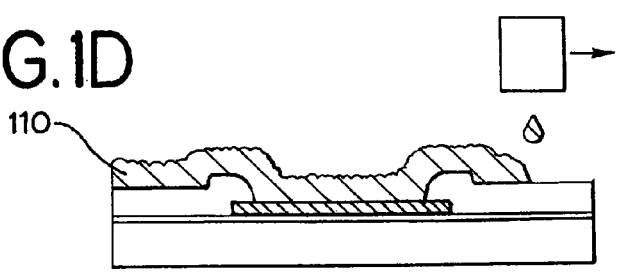
FIG.1E
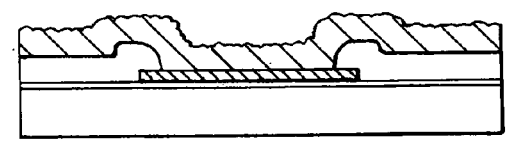
FIG.1F
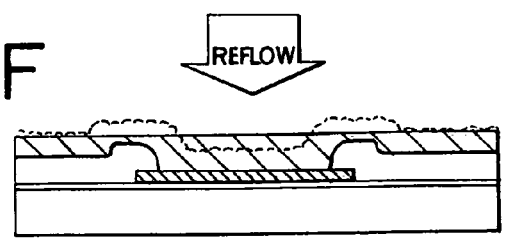

REFLOW

SWITCHING TFT    CAPACITOR

HEAT TREATMENT

SWITCHING TFT    CAPACITOR

SWITCHING TFT    CAPACITOR

SWITCHING TFT    CAPACITOR

SWITCHING TFT  DRIVING TFT    DRIVING TFT

SWITCHING TFT  DRIVING TFT    DRIVING TFT

HEAT TREATMENT

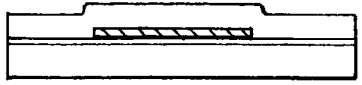

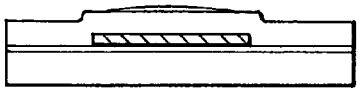

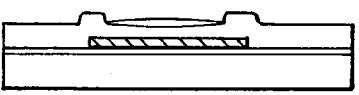

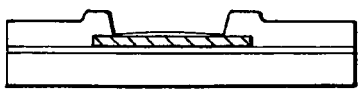

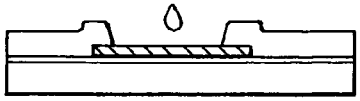

- 1700 SEVENTH LAYER
- SIXTH LAYER
- FIFTH LAYER
- FOURTH LAYER
- THIRD LAYER
- SECOND LAYER
- FIRST LAYER

REFLOW

1707

METHOD OF MANUFACTURING SEMICONDUCTOR DEVICE AND DISPLAY DEVICE

BACKGROUND OF THE INVENTION

1. Field of the Invention

The present invention relates to a method of manufacturing a wiring and a conductive layer. More specifically, the present invention relates to a method of manufacturing a wiring and a conductive layer over an insulating surface, a semiconductor device, and a display device by droplet discharging method.

2. Description of the Related Art

A thin film transistor (hereinafter referred to as a TFT) formed by using a thin film on an insulating surface is widely applied to integrated circuits and the like. Application of a display panel using TFTs greatly expands, in particular, into a large-scale display device. Thus higher definition, higher aperture ratio, superior reliability and growth in size for a screen have been extremely required.

According to the foregoing requirements, research has been actively carried out. Therefore, in order to enhance competitiveness of products, the fabrication of products, which is superior in cost effectiveness, is an indispensable condition in addition to fulfilling the above-mentioned requirements.

As a method for manufacturing the wiring in the thin film transistor, a method in which the entire surface of a substrate is coated with a conductive layer and an etching treatment is subsequently performed by using a mask can be noted (refer to Patent Document 1).

[Patent Document 1] Japanese Patent Laid Open No. 2002-359246

A sophisticated display device has also been increasingly required, and therefore an attempt to simultaneously form a display panel along with a driving circuit, a central processing unit (CPU), and the like on a same substrate has been carried out.

Further, in the case of forming a wiring according to the above-mentioned Patent Document 1, for example, when an ICP etching apparatus is used, in accordance with etching conditions such as bias power density, ICP power density, pressure, total flow of etching gases, an additive ratio of oxygen and a temperature of a lower electrode are increased, selective ratio of a resist and a conductive layer vary and the length or width of the conductive layer varies on the substrate.

In addition, in the case of performing an etching treatment, since an additional process for manufacturing a mask made of photoresist etc. is required, the number of processes is increased. Furthermore, wasted materials are generated since the etching treatment is performed so as to make the conductive film into a predetermined shape after the conductive layer is formed over the entire surface. In particular, a resist material used in patterning is extremely expensive, which adversely affects the costs of end products.

Further, materials used for etched portions or materials used for unused portions are removed, and eventually become waste fluids to dispose. In recent years, since awareness concerning environment has been raised, it is indispensable that the waste fluids are adequately treated and disposed. However, a huge amount of capital investment and costs are required for the disposal of the waste fluids. This problem is a significant obstacle to price reduction of manufactured goods. As a matter of course, such wasted materials are only disposed, which results in a waste of resources.

These problems become more serious when a wiring is formed over the large size substrate of which side exceeds 1.0 m.

On the other hand, a method of carrying out the patterning directly on the substrate by droplet discharging method has been beginning to be considered in recent years. Concerning this method, for example, a method of forming a wiring or electrode pattern directly on the substrate by using a special kind of ink in which metal microparticles are dispersed into a liquid solution has been proposed. Further, another method of forming such pattern by directly discharging resist by droplet discharging method is also proposed instead of carrying out the patterning by using a mask in the same manner as conventional photolithography.

However, when wirings are formed by droplet discharging method, there is a possibility that contact holes are not completely filled, or step differences are generated on the surface of the wirings. In the case where the contact holes are not completely filled, the wirings over the portions are not sufficiently contacted, and therefore the wirings are likely to be disconnected. There is also a possibility that the resistivity is increased, or gas (such as air) taken in the wirings is expanded in heating in the latter step, thereby causing disadvantages even if the wirings are completely connected. With respect to step differences generated over the surface of the wiring, when layers are laminated on the step differences and depressions or projections are overlapped each other, the step differences are grown up, which ultimately results in disadvantages such as disconnection of the wirings. These problems are serious in reliability.

Furthermore, the phenomena in which a liquid droplet containing conductive compositions is jetted and adhered to a substrate to form a thin film pattern is an extremely complicated process. Further, characteristics of the thin film pattern are significantly affected by a drying step. That is, the characteristics vary according to the shape of the liquid droplet after the step of drying the liquid droplet, and therefore depend on the drying step of the liquid droplet. The drying step is very difficult to be controlled, and hence, the control of the drying step becomes one of major problems for providing stable products.

SUMMARY OF THE INVENTION

In view of the foregoing problems, it is an object of the present invention to provide a method of forming wirings for providing a semiconductor device with higher reliability and superior cost performance. Furthermore, it is another object of the present invention to provide a method of manufacturing a semiconductor device and a display device by using the method of forming the wirings according to the present invention.

In order to overcome the above-described problems, with respect to the method of forming wirings by droplet discharging method according to the present invention, a reflow process is performed after the formation of the wirings in the present invention.

As a result, planarization, repair, and adjustment of the shape of the wirings can be carried out, and therefore, it is possible to provide a method of forming the wirings for providing a semiconductor device with higher reliability and superior cost performance, and a method of manufacturing a semiconductor device and display device.

According to one aspect of the present invention, there is provided a method of manufacturing a wiring by droplet discharging method, wherein a wiring is formed at a position including at least an opening in contact with a lower layer portion on an insulating film with the opening formed thereon by dropping a liquid droplet containing a conductive composition by droplet discharging method, and a surface of the wiring on the opening and a surface of the wiring other than the wiring on the opening is approximately leveled by performing a heat treatment over the substrate with the wiring formed thereon.

According to another aspect of the present invention, there is provided a method of manufacturing a wiring by droplet discharging method, wherein a wiring is formed at a position including at least an opening in contact with a lower layer portion on an insulating film with the opening formed thereon by dropping a liquid droplet containing a conductive composition by droplet discharging method, and the opening is filled by performing a heat treatment over the substrate with the wiring formed thereon.

According to still another aspect of the present invention, there is provided a method of manufacturing a wiring by droplet discharging method, wherein a wiring is formed at a position including at least an opening in contact with a lower layer portion on an insulating film with the opening formed thereon by dropping a liquid droplet containing a conductive composition by droplet discharging method, a surface of the wiring on the opening and a surface of the wiring other than the wiring on the opening is approximately leveled by performing a heat treatment over the substrate with the wiring formed thereon, and the opening is filled.

In each of the above aspects of the present invention, after the heat treatment, a mask is formed on the wiring, and the wiring is etched by using the mask.

In each of the above aspects of the present invention, a partition wall is formed on the substrate prior to the formation of the wiring, and the wiring formed by droplet discharging method is formed inside of the partition wall.

In each of the above aspects of the present invention, the mask is formed by droplet discharging method.

In each of the above aspects of the present invention, the partition wall is formed by droplet discharging method.

In each of the above aspects of the present invention, the step for forming the wiring is carried out under reduced pressure.

In each of the above aspects of the present invention, the heat treatment is performed by using a lamp.

In each of the above aspects of the present invention, the heat treatment is performed by irradiating laser beam.

In each of the above aspects of the present invention, the conductive composition comprises a solvent in which a material containing nanometal particles is dispersed.

The present invention further provides a method of manufacturing a display device by using the above-described method of forming the wiring.

The present invention allows to drastically reduce unevenness and contact defects of wirings, thereby enhancing the reliability and stability of the products considerably.

In addition, since the wirings are formed by droplet discharging method, materials can be applied only to a portion where is necessary to be applied, which results in a reduction in material costs. Moreover, since the waste fluids due to the etching treatment of the wirings are eliminated, the burden of waste disposal is reduced, which contributes to a reduction in price of products.

BRIEF DESCRIPTION OF THE DRAWINGS

In the accompanying drawings:

FIGS. 1A to 1F are diagrams according to Embodiment Mode 1;

DETAILED DESCRIPTION OF THE INVENTION

Figure 2A:
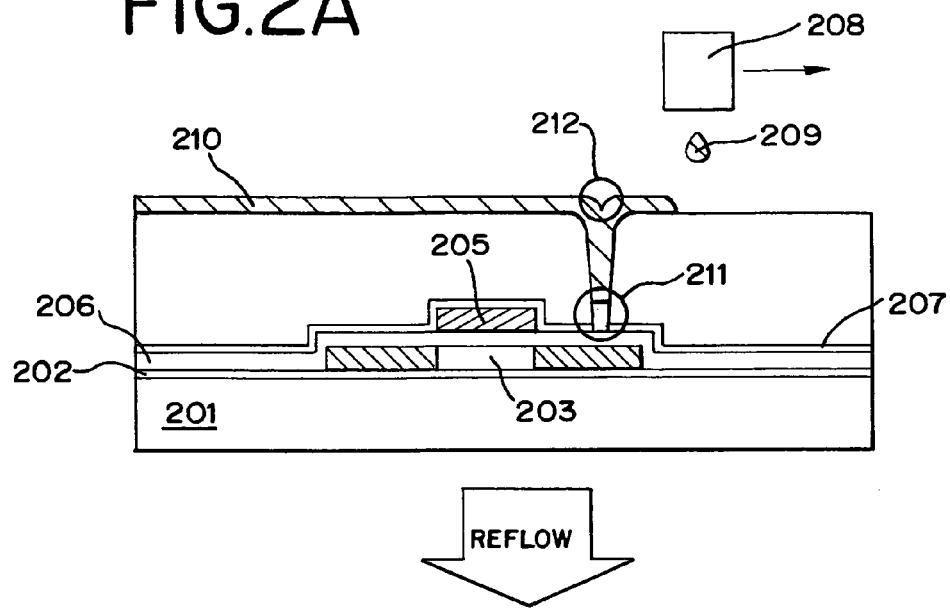
FIGS. 2A and 2B are diagrams according to Embodiment Mode 2.

Embodiment modes and embodiments of the present invention will hereinafter be described with reference to the accompanying drawings. Note that, as will be easily understood by those skilled in the art, the present invention can be implemented in various different embodiments, and the embodiments and its details can be changed and modified unless such changes and modifications deviate from the purpose and scope of the present invention. Accordingly, interpretation of the present invention should not be limited to descriptions explained in embodiment modes and embodiments.

Embodiment Mode 1

An embodiment mode of the present invention will be described in FIGS. 1A to 1C. They show an example in which a wiring is made so as to connect to a conductive layer 103 on a base insulating film 102, which is formed over a substrate 101, via an interlayer insulating film.

A liquid droplet 106 in which a conductive composition is dispersed is dropped from an inkjet nozzle 105 over a contact hole 111, which serves as an opening in contact with a lower layer portion formed in an interlayer insulating film 104 so as to form a wiring 107. At this moment, a step difference 114 is generated due to projections 112 over the wiring, which reflect projection portions according to the shape of the conductive layer 103 formed underneath the interlayer insulating film 104, and a depression 113, which reflects the shape of the contact hole (FIG. 1A).

When the step difference 114 is not processed by any sort of planarization treatment, the step difference is reflected in the shape of the upper layers as it is. A large step difference generated in a pixel portion of a display device sometimes reads to nonuniformity and defects in display. Further, when a multilayer wiring, which is effective in the case of integrating circuits with high density such as a CPU etc., is formed, if the step difference is generated, the step difference is widened by repeatedly laminating layers, and therefore defects due to the disconnection of the wiring and the like are easily generated.

Accordingly, the wiring 115 formed by droplet discharging method is reflowed by heating at a temperature of not less than the softening point of the conductive composition used for the wiring (FIG. 1B). The conductive composition used for the wiring is dispersed in a solvent such as an organic solvent. However, when heat is applied to the wiring, the solvent is evaporated, and hence the conductive composition dispersed among the solvent is condensed. When heat is further applied to the wiring, the temperature of heating is reached to the melting point of the conductive composition. Therefore, the fluidity of the conductive composition is increased again. Note that, the temperature at the beginning of increase in the fluidity and change in shape of the wiring is referred to as the softening point in this specification.

Since the fluidity of the conductive composition is increased by applying heat at a temperature of not less than the softening point, the wiring material is moved to the depression 113 due to propulsion such as surface tension, and potential energy. Therefore, the step difference 114 of the wiring 115 is lessened and leveled as illustrated in a wiring 109 in FIG. 1C.

Figure 11A:
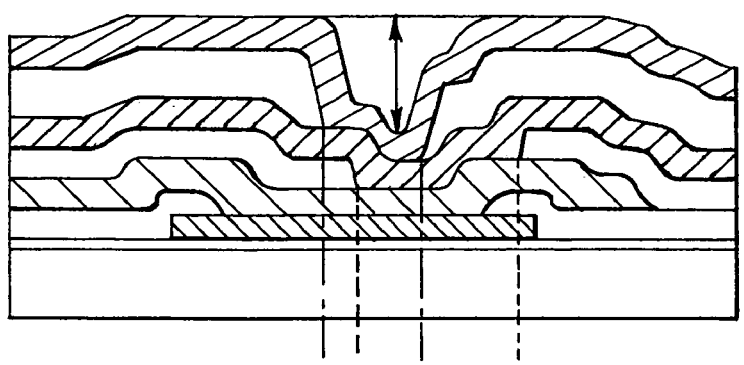
FIGS. 11A and 11B are diagrams showing an example of a formation of a multilayer wiring by droplet discharging method.
Figure 11B:
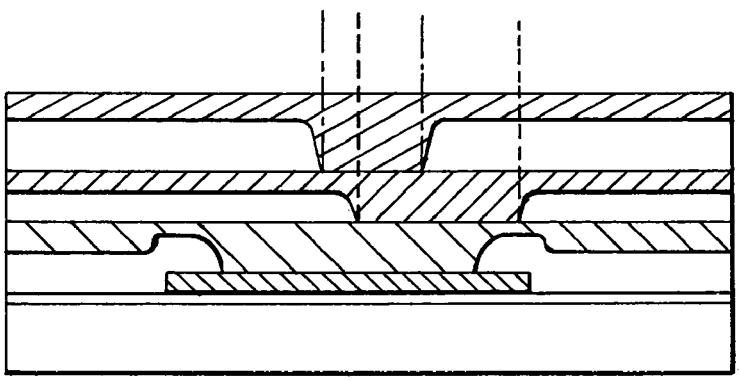

FIG. 11A shows a pattern diagram in which the reflow process is carried out, whereas FIG. 11B shows a pattern diagram in which the reflow process is not carried out. In FIGS. 11A and 11B, thickness of the interlayer insulating film, position of the contact hole, and diameter of the contact hole are identical to each other. As apparent from FIG. 11A, when a multilayer wiring is formed, unevenness over the surface of the multilayer wiring is grown every time layers are laminated thereon. Meanwhile, as depicted in FIG. 11B, the unevenness is apparently lessened and leveled by carrying out the reflow process.

When the surface of the wiring is planarized, the foregoing problems are hardly caused, thereby improving the reliability. Since the wiring is formed by droplet discharging method, the materials can be applied to only a portion where is necessary to be applied, which results in a reduction in material costs. Furthermore, since the waste fluids caused by etching the wiring can be eliminated, the burden of waste disposal is further reduced, which contributes to a reduction in price of products.

FIGS. 1D to 1F show forming the wiring under reduced pressure by droplet discharging method. Since the solvent dispersed in the liquid droplet is immediately vaporized, the application under reduced pressure by droplet discharging method has a great advantage in which the manufacturing process can be promptly carried out. However, there may be a case where the value of viscosity of the liquid droplet is increased, and the surface of the wiring 110 is not leveled as shown in FIGS. 1D and 1E. In this case, the step difference is improved and the surface of the wiring is leveled by performing the reflow process, and hence, high reliability can be achieved while reaping the benefit of application under reduced pressure (FIG. 1F).

Embodiment Mode 2

Figure 2B:
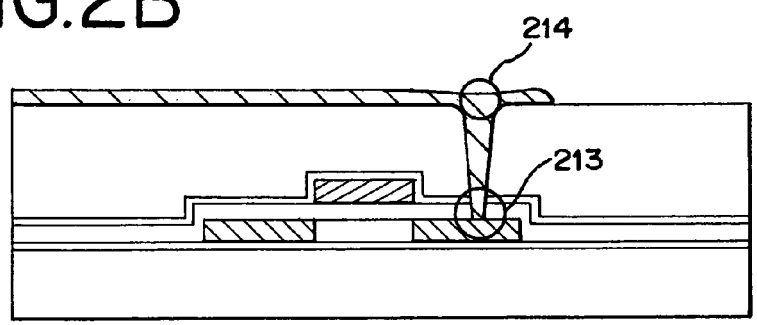

Another embodiment mode of the present invention will be described with reference to FIGS. 2A and 2B.

On a TFT (comprising a semiconductor layer 203, a gate insulating film 206, and a gate electrode 205) formed on a base insulating film 202 over a substrate 201, a wiring is partially formed in a portion required by droplet discharging method via a contact hole formed in an interlayer insulating film 207, which serves as an opening in contact with a lower layer portion.

A liquid droplet 209 in which a conductive composition is dispersed is dropped from a nozzle 208 to form a wiring 210. As explained in Embodiment Mode 1, the wiring 210 is formed in accordance with the shape of the contact hole and therefore a depression portion 212 is formed on the surface of the wiring 210. In addition, there may be a case in which the liquid droplet is not completely filled in a contact hole having a lagerer aspect ratio and the like, and a contact defect 211 is caused. The contact defect is particularly caused when the wiring is formed under reduced pressure by droplet discharging method (FIG. 2A).

In order to overcome the above-mentioned problems, the wiring is reflowed by applying heat of not less than a temperature of softening the conductive composition constituting the wiring 210, and increasing the fluidity of the conductive composition (softening point). Accordingly, the step difference of the depression 212 is improved, the contact hole is completely filled with the liquid droplet, and hence, the depression 212 and the contact defect 211 are repaired in such a manner as denoted by reference numerals 214 and 213 in FIG. 2B, respectively.

As a result, wiring defects generated by droplet discharging method can be repaired by carrying out the reflow process. Furthermore, products, which are superior in cost-performance, process, and reliability, can be manufactured.

Embodiment Mode 3

In Embodiment Mode 3, still another embodiment according to the present invention is further described with reference to FIGS. 3A to 3E. Liquid droplets in which a conductive composition is dispersing are dropped from nozzles 301 in contact holes formed so as to connect to TFTs by droplet discharging method, and therefore wirings 302 are formed.

Figure 3A:
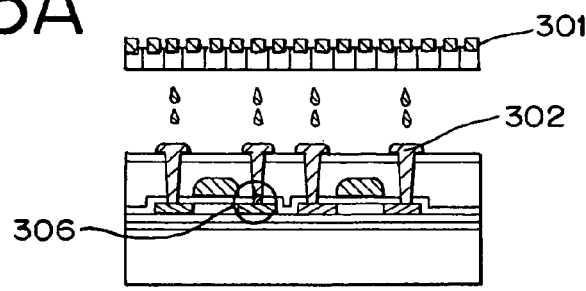
FIGS. 3A to 3E are diagrams according to Embodiment Mode 3.

As has been described above, there is a possibility that unevenness in accordance with the shape of the contact holes and a contact defect 306 are generated in the wirings 302 (FIG. 3A).

Figure 3B:
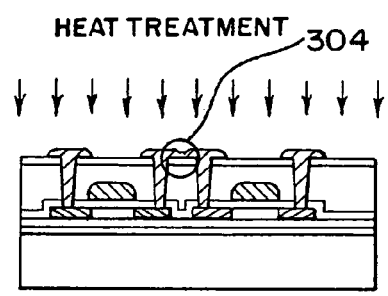

These problems can be solved by heating the wirings at a temperature higher than the softening point of the conductive composition which constitutes the each wiring so as to carry out a reflow process (FIG. 3B).

However, as illustrated in reference numeral 304 in FIG. 3B, there is also a possibility that the wirings extended due to the reflow process are shorted at a portion where is necessary to be patterned minutely such as a driving circuit and an integrated circuit. Further, at the time of dropping the liquid droplets by droplet discharging method, the wirings may be shorted at the portion in which the microscopic pattern is required.

Figure 3C:
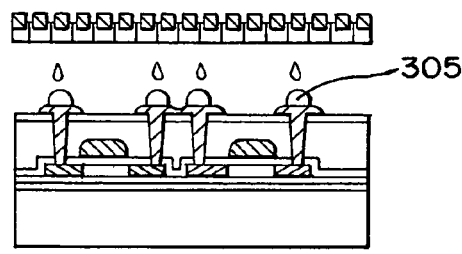
Figure 3D:
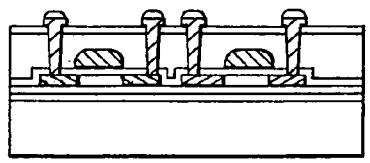
Figure 3E:
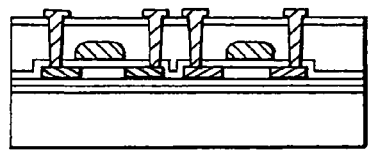

In order to overcome the foregoing problems, using masks 305 (as illustrated in FIG. 3C) the wirings are selectively etched (FIGS. 3D and 3E), while at the portion where is necessary to be minutely patterned, such as the driving circuit and the integrated circuit. Accordingly, products with higher reliability can be manufactured even if a highly integrated circuit is formed. As compared with the method of forming the wirings only by droplet discharging method, an additional etching process is added thereto. However, when the masks are formed by droplet discharging method, the mask materials can be reduced, which reads to superior cost performance.

When more microscopic pattern is required, masks are preferably made of a photosensitive material such as resist by droplet discharging method, and then etching is preferably carried out through a light exposure step and a developing step while using masks. As compared with the conventional technique in which resist is applied over the entire surface, and the light exposure step and the developing step are carried out, the amount of resist used is drastically reduced even if the additional etching process is added.

The present invention can be, of course, applied to the case where a mask formed of resist is coated over the entire surface.

Embodiment Mode 4

Figure 4A:
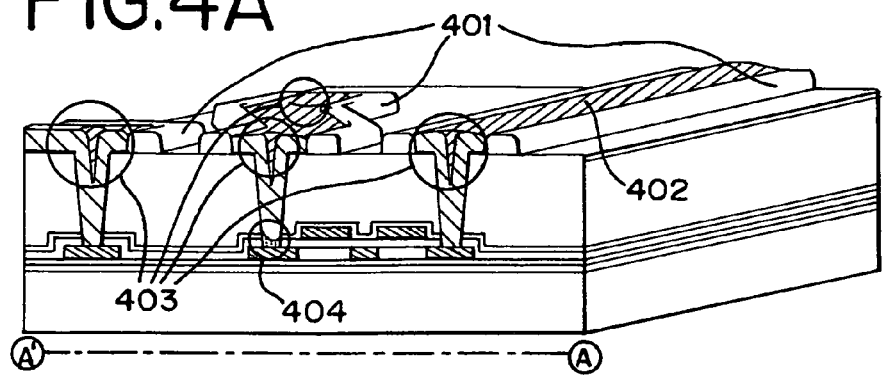
FIGS. 4A to 4C are diagrams according to Embodiment Mode 4.
Figure 4B:
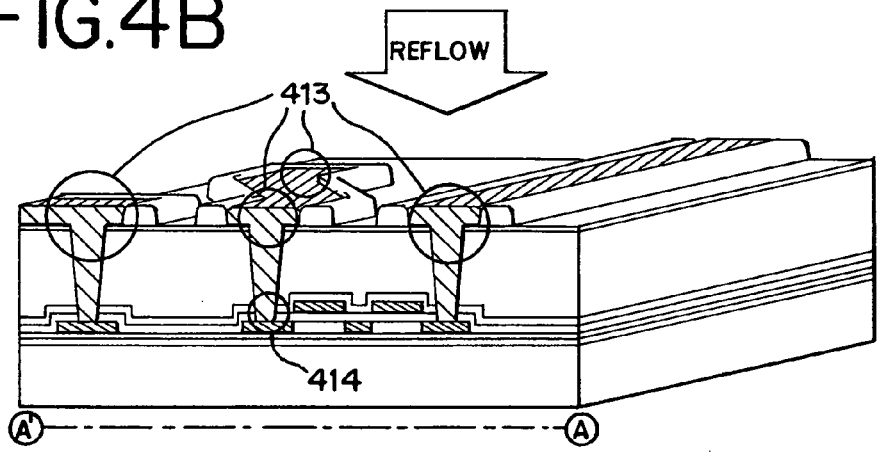
Figure 4C:
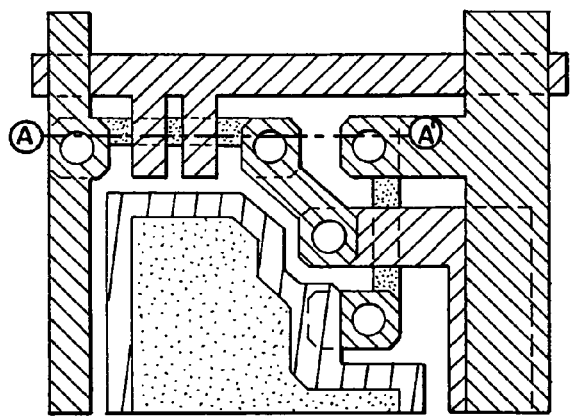

Another embodiment mode of the present invention will be described with reference to FIGS. 4A to 4C. FIGS. 4A and 4B are perspective views taking along a line A–A' in FIG. 4C. Note that ratios of film thicknesses etc. are changed for the sake of convenience in the drawings, and such ratios may be different from the actual ratios thereof. Further, some details are omitted in FIGS. 4A to 4C.

In Embodiment Mode 4, an interlayer insulating film etc. is formed over a TFT, contact holes are formed thereon, and then partition walls 401 are formed along wiring patterns. Preferably, the partition walls 401 are formed by dropping a material by droplet discharging method. However, the method of forming the partition walls is not limited thereto. An insulator which can withstand heat-treatment temperature of the reflow process and can serve as a partition wall is preferably used for the material of the partition walls. The partition walls 401 can be selectively removed after the termination of the reflow process. If it is assumed that the partition walls are removed after the reflow process, the partition walls 401 may not be formed of the insulator. The material of the partition walls can be appropriately selected by those who operate the present invention. The process for forming the partition walls may be carried out prior to the formation of the contact holes.

Subsequently, liquid droplets in which a conductive composition is dispersed are dropped inside of the partition walls by droplet discharging method to form wirings as represented by a wiring 402 in FIG. 4A. As has been described above, depressions 403 are formed over the surface of the wirings in accordance with the shape of the contact holes. There may be a case where the contact holes are not completely filled with the liquid droplets as denoted by reference numeral 404, and contact defects are generated (FIG. 4A).

When the liquid droplets are dropped along the wiring patterns by droplet discharging method, the wirings are reflowed by performing a heat treatment at a temperature of not less than the softening point of the conductive composition constituting the wirings.

As a result, unevenness in the depressions is reduced, each surface of the wirings is leveled as denoted by reference numeral 413, and the contact defects are repaired by completely filling the liquid droplets in to the contact holes as denoted by reference numeral 414, thereby solving the problems which are attributed thereto (FIG. 4B). Accordingly, the reliability is remarkably improved. Since the partition walls are formed, the wirings subjected by the reflow process are not extends to inexpedience portions, thereby preventing a short circuit. Further, when a microscopic pattern is formed, the reliability can be maintained. Since the droplet discharging method is employed in these processes, the materials can be effectively utilized, and superior cost performance can be provided. Furthermore, since only the necessary portions are processed, the processing treatment can be promptly carried out even if a large-area substrate is processed.

Although an example of a pixel portion of a display device is described in Embodiment Mode 4, the present embodiment mode is not limited thereto. Embodiment Mode 4 can be applied to an integrated circuit represented by a CPU and the like.

Figure 18A:
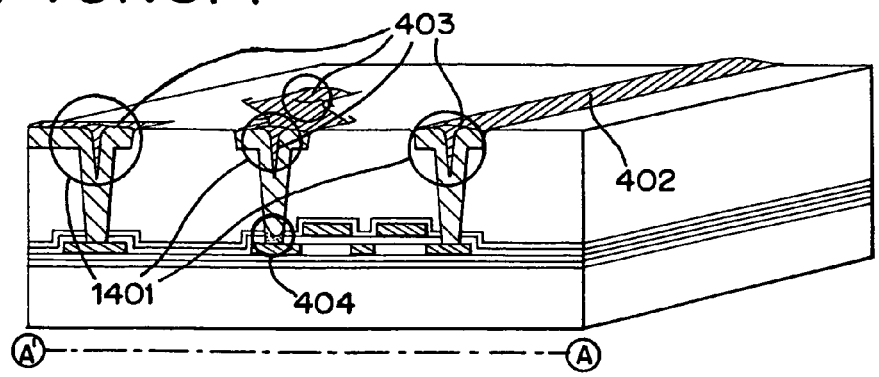
FIGS. 18A to 18C are diagrams according to Embodiment Mode 4.
Figure 18B:
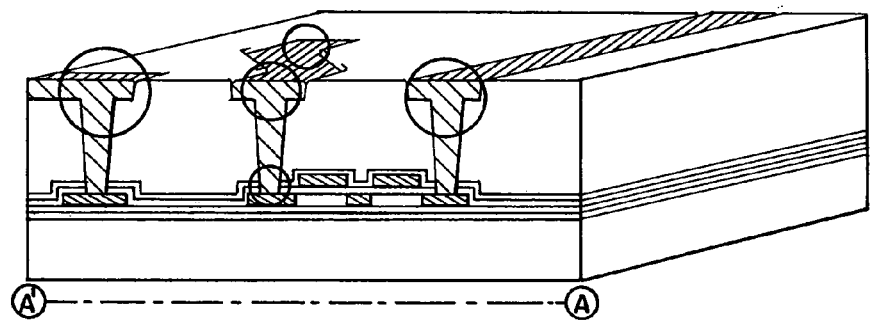
Figure 18C:
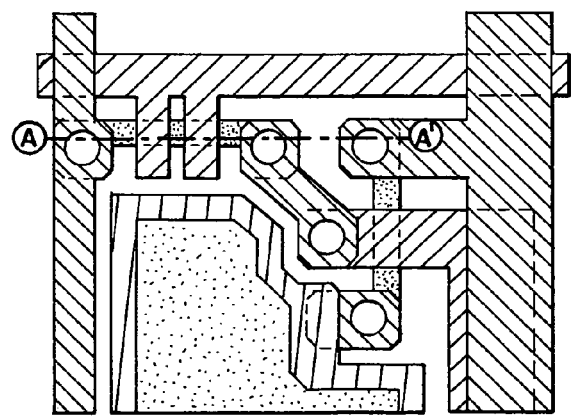

Note that, the present embodiment mode can be implemented by providing grooves 1401 as a substitute for the partition walls as illustrated in FIGS. 18A to 18C. FIGS. 18A and 18B are perspective views taking along a line A–A' in FIG. 18C.

EMBODIMENTS

Embodiment 1

A method of manufacturing an active matrix liquid crystal display device will be described in more detail as one example of the present invention with reference to FIGS. 5A to 5D and FIGS. 6A to 6D. In the present embodiment, a conventional patterning treatment using photolithography is not utilized. However, a liquid crystal display device with higher reliability can be achieved by arbitrarily combining Embodiment 1 with foregoing Embodiment Modes 3 and 4. The use of a conventional processing is entrusted to those who operate the present invention, if necessary.

With respect to the active matrix liquid crystal display device, a step of manufacturing an n-channel TFT (for switching TFT) and a storage capacitor over a same substrate will be described hereinafter according to the present invention.

Figure 5A:
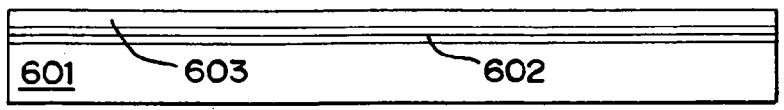
FIGS. 5A to 5D are diagrams according to Embodiment 1.

A substrate 601 is made of a substrate, which can withstand the processing temperatures of the steps, such as a glass substrate, and a flexible substrate represented by a plastic substrate (FIG. 5A). More specifically, an active matrix substrate is formed by the substrate 601 having a light transmitting property. The substrate with a large area as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is desirably used, thereby reducing manufacturing costs. A substrate made of barium borosilicate glass, aluminoborosilicate glass, and the like, as typified by #7059 glass or #1737 glass produced by Corning Inc. can be used. In addition, a transparent substrate such as a quartz substrate and a plastic substrate can be used alternatively.

In this embodiment, the substrate 601 is formed of the glass substrate. Subsequently, a base film 602 formed of an insulating film is formed over the substrate 601. The base film 602 may have a single layer structure or a laminated structure. In this embodiment, the base film 602 has a two-layer structure. A 50-nm-thick silicon nitride oxide film is formed as a first layer and a 50-nm-thick silicon oxynitride film is formed as a second layer by sputtering for the two-layer structure of the base film 602. The surface of the base film 602 is leveled by CMP (chemical mechanical polishing) and the like (FIG. 5A).

A semiconductor layer 603 is formed over the base film 602. The semiconductor layer 603 is formed with a thickness of from 25 nm to 80 nm by a known method (such as sputtering, LPCVD or plasma CVD). The semiconductor layer 603 is then crystallized by a known crystallization method (such as laser crystallization, thermal crystallization using RTA or an annealing furnace, or thermal crystallization using a metal element facilitating the crystallization). As the semiconductor layer, an amorphous semiconductor film, a microcrystalline semiconductor film, and a crystalline semiconductor film may be used, further, a compound semiconductor film having an amorphous structure such as an amorphous silicon germanium film also can be applied thereto.

Figure 5B:
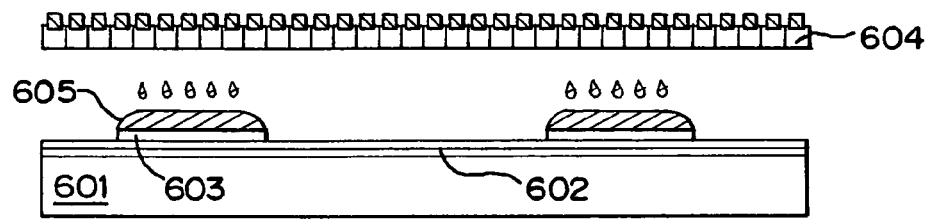

A 50-nm-thick amorphous silicon film is formed as the semiconductor layer 603 by plasma CVD. Then, a solution containing nickel is applied and held over the amorphous silicon film, dehydrogenation (at 500° C. for 1 hour) is performed on the amorphous silicon film, and then, thermal crystallization (at 550° C. for 4 hours) is carried out thereto, thereby forming a crystalline silicon film. Thereafter, mask patterns are formed by resists 605, which are discharged from inkjet nozzles 604 by droplet discharging method. The semiconductor layer 603 is further formed by dry etching using the mask patterns (FIG. 5B).

Note that, a continuous oscillation type or pulse oscillation type gas laser or solid-state laser may be employed, as a laser used in the case where the crystalline semiconductor film is formed by laser crystallization. As the former gas laser, an excimer laser, a YAG laser and the like are used. Also, as the latter solid-state laser, a laser that uses crystals such as YAG, and $YVO_4$ doped with Cr, Nd and the like is used. Note that, in crystallization of the amorphous semiconductor film, it is preferable that the solid-state laser capable of continuously oscillating be used and that the oscillation of any one of the second harmonic wave through the fourth harmonic wave with respect to the fundamental wave be applied in order to obtain crystals with a large grain size. In the case of using the above-mentioned lasers, the laser beam emitted from a laser oscillator is condensed in a linear shape by an optical system, and the semiconductor film is preferably irradiated with the laser beam.

In this embodiment, since the amorphous silicon film is crystallized by using a metal element that promotes crystallization, the metal element remains in the crystalline silicon film. In order to remove the metal element, an amorphous silicon film with a thickness of from 50 nm to 100 nm is formed over the crystalline silicon film, and a heat treatment (such as RTA or thermal annealing using an annealing furnace) is performed thereon to disperse the metal element into the amorphous silicon film. Subsequently, the amorphous silicon film is etched to remove the metal element. As a result, the metal element content of the crystalline silicon film can be reduced or eliminated. After forming the semiconductor layer 603, a minute amount of impurity elements (boron) may be doped (channel doping) so as to control the threshold value of a TFT.

Then, a gate insulating film 606 for covering the semiconductor layer 603 is formed. The gate insulating film 606 is formed of an insulating film containing silicon by plasma CVD or sputtering to have a thickness of from 40 nm to 150 nm. In this embodiment, a silicon oxynitride film is formed to have a thickness of 115 nm by plasma CVD as the gate insulating film 606.

Figure 5C:
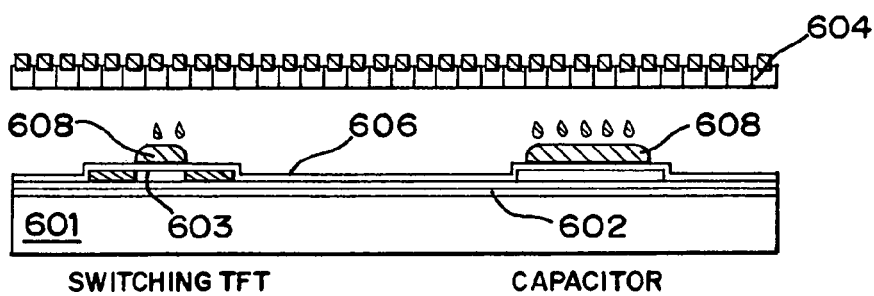

Further, a first conductive layer (such as a gate wiring, a gate electrode, and a capacitor electrode) 608 is formed by droplet discharging method under reduced pressure or in vacuum (FIG. 5C).

A plurality of inkjet nozzles is used for inkjetting. Further, a plurality of inkjet heads each having a different nozzle diameter may be provided so as to use the plurality of inkjet heads appropriately depending on the application. Each inkjet head has a nozzle diameter of from 50 μm to 100 μm. Although the throughput depends on the nozzle diameter, a plurality of nozzles may be arranged in parallel so as to have the same length as that of one row or one column to form by scanning once in consideration of the throughput. Alternatively, an arbitrary number of nozzles may be provided to scan plural times and plural times of scanning may be performed on the same portion for recoating. Further, the inkjet heads are preferably scanned, but the substrate may be moved instead. The distance between the substrate and the ink-jet heads is preferably as short as possible so as to drop a liquid droplet on desired portions, specifically, appropriately from 0.1 mm to 2.0 mm.

Preferably, the amount of composition jetted once from the inkjet head is from 10 pl to 70 pl, the viscosity is 100 cp or less, the grain size is 0.1 μm or less. This is because the viscosity is too high to apply the composition smoothly from the ink-jet heads. And the above conditions can prevent drying out. Thus, the viscosity, the surface tension, the drying rate, etc of the composition, are properly adjusted in accordance with the solvent to be used and the purpose. The composition discharged from the inkjet heads is preferably formed in a linear shape or a stripe shape by consecutively dropping the composition on the substrate. However, the composition may be dropped onto the predetermined spots, per dot, for example.

As the composition jetted from the inkjet head, the one in which a conductive material arbitrarily selected from an element of tantalum (Ta), tungsten (W), titanium (Ti), molybdenum (Mo), aluminum (Al), silver (Ag), copper (Cu), chromium (Cr), and neodymium (Nd), an alloy material or compound material mainly containing the above elements, an Ag alloy such as an AgPdCu alloy, and an Al alloy, is dissolved and dispersed in a solvent may be used. As the solvent, following organic solvent may be used: ester such as butyl acetate, and ethyl acetate; alcohols such as isopropyl alcohol, and ethyl alcohol; methyl ethyl ketone; acetone, and the like. The concentration of the solvent may be properly determined according to the types of the conductive materials.

Ultrafine particles (nanometal particles) in which silver (Ag), gold (Au), or platinum (Pt) is dispersed into a solvent with a grain size of 10 nm or less may be used for the composition jetted form the inkjet head. The problem of the clogged nozzle can be solved by using the composition in which fine particles with a fine grain size are dispersed or dissolved in the solvent. The grain size of the constituent material of the composition is required to be smaller than the diameter of the nozzle in the present invention using droplet discharging method. Further, a conductive polymer such as polyethylene dioxythiophene/polystyrenesulfonic acid (PEDT/PSS) solution may be used instead.

When a low resistance metal such as silver and copper is used as a wiring material, the wiring resistance can be lowered, and therefore, such a low resistance metal is preferably used in the case of using a large size substrate.

Since these metal materials are difficult to be processed by conventional dry etching, it is extremely effective that these metal materials are directly patterned by droplet discharging method. In the case of using copper and the like, for instance, a conductive film having a barrier function, which can hinder dispersion of the copper and the like, is preferably provided so as not to have an adverse affect on the electric characteristic of a transistor. By forming the conductive film having a barrier function, a wiring can be formed without dispersing copper into a semiconductor included in the transistor. As the conductive film having a barrier function, one kind of or plural kinds of laminated films selected from tantalum nitride (TaN), titanium nitride (TiN), and tungsten nitride (WN) may be used. Preferably, an oxidation inhibitor is used at the same time since copper is easily oxidized.

Thereafter, the solvent is volatilized to enhance the density of the composition and reduce the resistance value by performing a heat treatment on the substrate with a first conductive layer formed thereon within the range of from 150° C. to 300° C. in normal pressure, under reduced pressure, or in vacuum. The solvent in the composition jetted from the inkjet nozzle 604 is preferably the one which evaporates after dropping the composition on the substrate. In comparison with the case where the ink-jetting is performed in normal pressure, the evaporation rate is higher in the case where the ink-jetting is performed under reduced pressure. More specifically, when a solvent having higher volatility such as toluene is used, the solvent is immediately volatilized after dropping the composition on the substrate. In that case, the heat treatment step may be omitted. However, the solvent of the composition is not particularly limited, and in the case of using the solvent which evaporates after the dropping, the density of the composition may be enhanced by performing the heat treatment so as to reduce the resistance value to a desired value. The heat treatment may be performed every time a thin film is formed by droplet discharging method or every optional step, or after finishing the whole steps. Note that the heat treatment step may be omitted when the reflow process is carried out.

A lamp annealing apparatus in which the substrate is directly and rapidly heated by using a lamp such as a halogen lamp as a heat source or a laser irradiation apparatus in which the substrate is irradiated with laser beam is used for the heat treatment. A heat treatment can be performed only on the desired portion by scanning the heat source itself in each apparatus. As the other methods for the heat treatment, an annealing furnace which is set at a predetermined temperature may be used. When a lamp is used, light having a wavelength, which dose not destroy the composition of the thin film to be heat-treated and is capable of only heating, is used for irradiation, and for example, light having a longer wavelength than 400 nm, namely, light having the longer wavelength than that of infrared light is preferably used. In consideration of the handling, a far-infrared ray (the typical wavelength is from 4 µm to 25 µm) is preferably used. On the other hand, when laser beam is used, the beam spot on the substrate of the laser beam oscillated from the laser oscillator is preferably formed to have a linear shape so as to have the same length as that of the row or column of the substrate. Accordingly, the laser irradiation can be finished by scanning once. In this embodiment, a normal annealing furnace is used for the heat treatment.

Subsequently, an impurity element imparting an n-type or p-type conductivity is doped into the semiconductor layer 603 by using the gate electrode 608 as a mask. In this embodiment, an impurity element imparting n-type or p-type conductivity is added into the semiconductor layer 603, thereby forming an impurity region. At the same time, a region where is not doped with any impurity elements or a region where is doped with a minute amount of impurity elements (which is generally referred to as a channel formation region) is formed.

A first interlayer insulating film 609 is formed for covering the entire surface. The first interlayer insulating film 609 is made of an insulating film containing silicon with a thickness of from 40 nm to 150 nm by plasma CVD or sputtering. In this embodiment, a 100-nm-thick silicon nitride film is formed as the first interlayer insulating film 609 by plasma CVD. A well as the first interlayer insulating film, a second interlayer insulating film 610 is formed for covering the entire surface. As the second interlayer insulating film 610, a silicon oxide film formed by CVD, a silicon oxide film applied by a SOG (Spin On Glass) method or spin coating, an organic insulating film such as acrylic or a non-photosensitive organic insulating film is formed with a thickness of from 0.7 µm to 5.0 µm. A 1.6-µm-thick acrylic film formed by coating is used for the second interlayer insulating film in this embodiment. Note that the second interlayer insulating film 610 is provided for the sake of smoothing unevenness due to a TFT formed over the substrate 601 and leveling the surface, and thus, a film having a superior leveling property is favorable. Further, a silicon nitride film is formed to be 0.1 µm thick as a third interlayer insulating film 611.

Figure 5D:
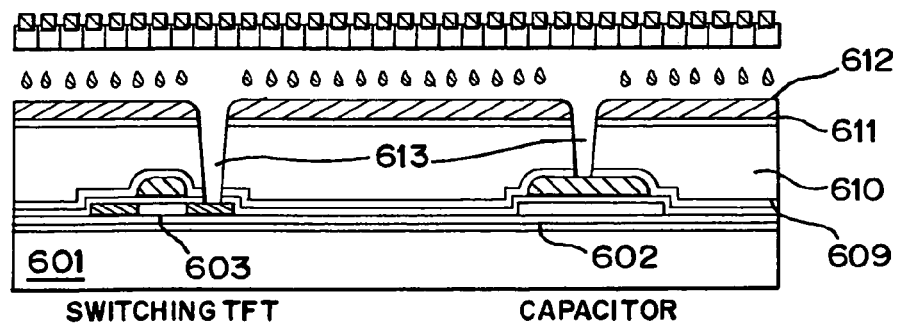

Subsequently, resist patterns 612 for forming contact holes 613 are formed by droplet discharging method as well as the above-described case. The contact holes 613 are formed by anisotropic dry etching while using the resist patterns as masks (FIG. 5D).

Figure 12A:
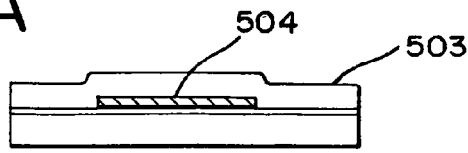
FIGS. 12A to 12F are diagrams showing an example of a formation of a contact hole by droplet discharging method.
Figure 12B:
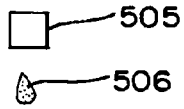
Figure 12C:
Figure 12D:
Figure 12E:
Figure 12F:
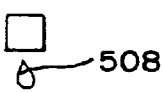

As set forth above, the contact holes may be formed by applying the resist. As another method of forming the contact holes, the contact holes may be formed in such a way that an interlayer insulating film 503 is etched by dropping an etching solution 506 from a nozzle 505 of an inkjet apparatus as illustrated in FIGS. 12A to 12E. After the formation of the contact holes, the inkjet nozzle is preferably changed to wash the contact holes by dropping cleaning fluid 508 in order to minimize damages to the underlying layers of the wiring or a conductive layer 504 (FIG. 12F).

Figure 6A:
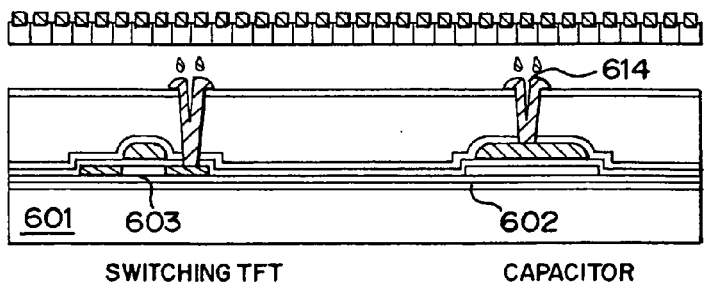
FIGS. 6A to 6D are diagrams according to Embodiment 1.

After the resist patterns 612 are removed, a second conductive layer (source wiring and drain wiring) 614 is formed so as to extend to bottom portions of the contact holes 613. In this embodiment, a liquid in which fine particles of an alloy of silver and aluminum are dispersed among an organic solvent by using a dispersing agent is used as the composition jetted from the inkjet nozzle. An alloy in which the composition ratio of aluminum is set to approximately from 40 atoms % to 80 atoms % to silver is preferably used. In addition to that, following materials may also be used as the composition jetted from the inkjet nozzle: aluminum; an alloy of aluminum and germanium; an alloy of silver and germanium; an alloy of silver and tin, and the like. The materials for the composition can be arbitrarily selected by those who execute the present invention. A cross sectional view at this moment is illustrated in FIG. 6A.

A gate electrode pattern formed of Al or a source/drain region on a Si pattern is exposed at the bottom of the contact holes. Since the contact holes are necessary to be filled with the liquid droplets sufficiently, more liquid droplets must be discharged in the contact holes in comparison with the portions other than the contact holes. In addition, for the purpose of suppressing the defects of contact resistance, it is important that the application quantity in the contact holes is increased by recoating. Incidentally, in the case of forming the second conductive layer 614, the viscosity of the jetted composition is necessary to be set to an optimal value.

Figure 6B:
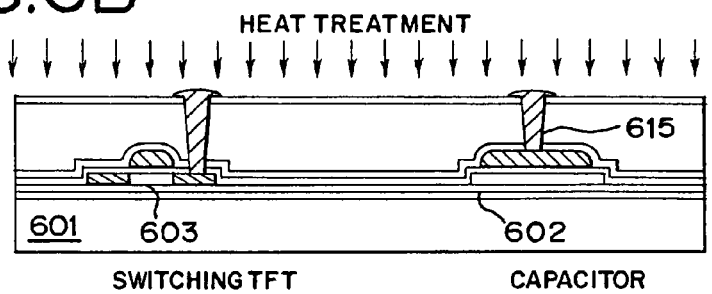

Subsequently, the heat treatment is carried out. The heat treatment may be performed by RTA, GRTA, laser irradiation, lamp heating, and the like. A reflow process is carried out by immediately heating at a temperature of from 500° C. to 600° C. since the wirings are made of an alloy of Ag and Al in this embodiment (FIG. 6B). Accordingly, unevenness reflecting the form of the contact holes and nonuniformity of the form of the wiring due to the drying step can be modified and repaired. Such unevenness and differences in the form of the wiring can be repaired even if the composition is not sufficiently filled in the contact holes. According to the forgoing processes, a transistor can be formed on the substrate 601 having an insulating surface.

Figure 6C:
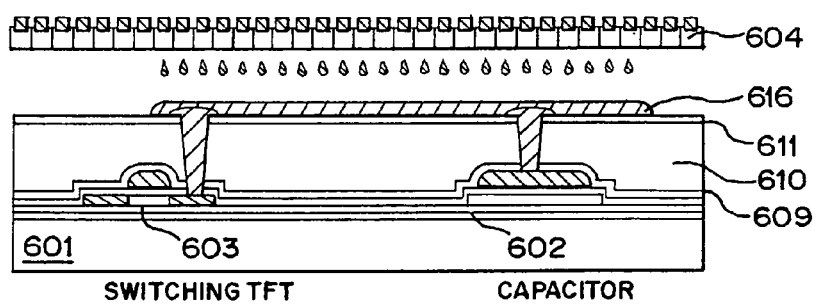

Next, a pixel electrode 616 formed of a transparent conductor is entirely formed so as to electrically connect to the second conductive layer 615 (FIG. 6C). The pixel electrode 616 may be made of, for instance, a compound of indium oxide and tin oxide (ITO), a compound of indium oxide and zinc oxide, zinc oxide, tin oxide, indium oxide, titanium nitride, and the like. In this embodiment, as the pixel electrode 616, an ITO film is formed to a thickness of 0.1 µm by droplet discharging method.

Figure 6D:
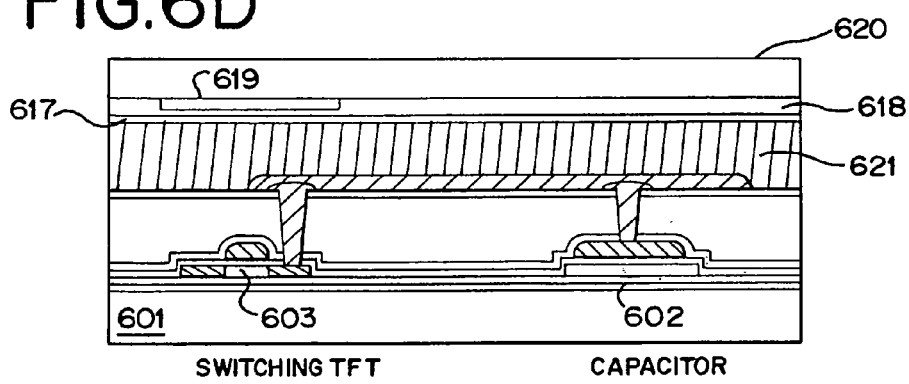

Accordingly, an active matrix substrate having a pixel portion comprising a source wiring, a TFT, and a storage capacitor, and a terminal portion can be manufactured. Further, the active matrix substrate or an opposing substrate is cut into a desired shape, if necessary. Subsequently, thus obtained active matrix substrate is attached to an opposing substrate 620 on which a common electrode 617, a color filter 618, a black matrix 619 and the like are formed. Liquid crystal 621 is injected by using a predetermined technique, and hence, a liquid crystal display device is completed (FIG. 6D).

A liquid crystal module thus manufactured according to the foregoing processes is equipped with a backlight and a light guiding plate and covered with a cover material, and hence, an active matrix liquid crystal display device (light transmission type) can be completed. Note that the cover material is fixed to the liquid crystal module by using an adhesive, an organic resin, and the like. Since the active matrix liquid crystal display device is a transmissive type, polarizing plates are attached to each side of the active matrix substrate and the opposing substrate.

Although the present embodiment shows the transmissive liquid crystal display device, the present invention is not limited thereto, and a reflective liquid crystal display device, a semi-transparent liquid crystal display device, and the like can be manufactured. In the case of manufacturing the reflective liquid crystal display device, the pixel electrode may be formed of a metal film having a higher light reflectance, more specifically, a material film containing aluminum or silver as its main constituent, a lamination film thereof, and the like.

With respect to a portion where is necessary to be highly integrated such as a driving circuit portion, when the wiring is partially manufactured by combining Embodiment 1 with Embodiment Mode 3 or Embodiment Mode 4, the reliability of the liquid crystal display device can be further improved. Of course, the wiring can be entirely formed.

As set forth above, Embodiment 1 of the present invention is described about the active matrix liquid crystal display device. However, the present invention is not limited to Embodiment 1, and can similarly be applied based on the scope of the present invention. For example, the present invention can also be applied to the case of manufacturing an active matrix organic EL display device. The materials or the formation method described in this embodiment can be used appropriately and selectively in accordance with the scope of the present invention.

Embodiment 2

A second embodiment of the present invention will be described in more detail with reference to FIGS. 7A to 7D and FIGS. 8A to 8D. In Embodiment 2, a liquid crystal display device is manufactured without performing a conventional patterning treatment using photolithography. However, a liquid crystal display device with more improved reliability can be manufactured by combining Embodiment 2 with foregoing Embodiment Modes 3 and 4. The use of the conventional processing is entrusted to those who operate the present invention, if necessary.

Figure 7A:
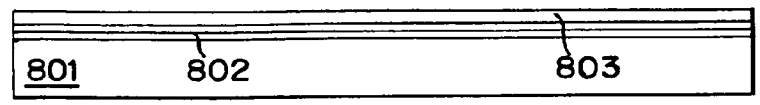
FIGS. 7A to 7D are diagrams according to Embodiment 2.

A glass substrate, a flexible substrate typified by a plastic substrate, and the like, which can withstand the processing temperature of the steps, are used for a substrate 801 (FIG. 7A). In this embodiment, the substrate 801 is made of a glass substrate. A base film 802 made of an insulating film is formed on the substrate 801. The base film 802 may be either of a single layer or laminated layers. In this embodiment, the base film has a two-layer structure. A 50-nm-thick silicon nitride oxide film is formed for a first layer and a 50-nm-thick silicon oxynitride film is formed for a second layer by sputtering for the two-layer structure of the base film. Then the surface is leveled by CMP, and the like (FIG. 7A).

Subsequently, a semiconductor layer 803 is formed over the base film 802. As the semiconductor layer 803, a semiconductor film is formed with a thickness of from 25 nm to 80 nm by a known method (such as sputtering, LPCVD, plasma CVD). Then, the semiconductor film is crystallized by a known crystallization method (such as laser crystallization, thermal crystallization using RTA or an annealing furnace, and thermal crystallization using a metal element that promotes crystallization). Note that, an amorphous semiconductor film, a microcrystalline semiconductor film, a crystalline semiconductor film, a compound semiconductor film with an amorphous structure such as an amorphous silicon germanium film, and the like may be used as the semiconductor film.

As well as Embodiment 1, a 50-nm-thick amorphous silicon film is formed by using plasma CVD. A solution containing nickel is applied and held over the amorphous silicon film, dehydrogenation (at 500° C. for 1 hour) is performed on the amorphous silicon film, and thermal crystallization (at 550° C. for 4 hours) is carried out thereon, thereby forming a crystalline silicon film. Thereafter, a resist, which is discharged from an inkjet head 807, is patterned under reduced pressure or in vacuum, and thus obtained resist pattern is further patterned by mask resist. Thus semiconductor layers 804 to 806 are formed by dry etching while using the resist pattern as a mask (FIG. 7B).

Subsequently, a gate insulating film 809 is formed. As the gate insulating film 809, a silicon oxynitride film is formed to a thickness of 115 nm by plasma CVD (FIG. 7B).

Figure 7B:
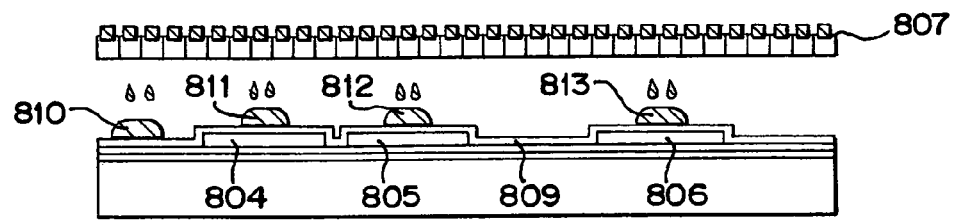

In the same manner as Embodiment 1, first conductive layers (gate wirings and a gate electrode) 810 to 813 are made of a tungsten film under reduced pressure or in vacuum (FIG. 7B).

Thereafter, the solvent is volatilized to obtain favorable electric conductive properties by performing a heat treatment on the substrate with the first conductive layers formed thereon within the range of from 150° C. to 300° C. in normal pressure, under reduced pressure, or in vacuum. The solvent in the composition jetted from the inkjet head 807 is preferably the one which evaporates after dropping the composition on the substrate. When the solvent having higher volatility such as toluene is used, the solvent is volatilized immediately after dropping the composition on the substrate. In this case, the heat treatment step may be omitted. However, the solvent of the composition is not particularly limited thereto, and in the case of using the solvent which evaporates after the dropping, the viscosity of the composition may be reduced to obtain the desired viscosity value by performing the heat treatment. The heat treatment may be performed every time a thin film is formed by droplet discharging method or every optional step, or after finishing the whole steps. In the case of performing a reflow process, the heat treatment step may be omitted.

Subsequently, an impurity element imparting an n-type or p-type conductivity is doped into the semiconductor layers 804 to 806 while using the gate electrodes 811 to 813 as masks. In this embodiment, an impurity element imparting n-type conductivity is added into the semiconductor layer 804, and an impurity element imparting p-type conductivity is added into the semiconductor layers 805 and 806, thereby forming impurity regions. At the same time, regions where are not doped with any impurity elements or regions where are doped with a small amount of impurity elements (which are generically referred to as channel formation regions) are formed.

A first interlayer insulating film 814 for covering the entire surface is formed. The first interlayer insulating film 814 is made of an insulating film containing silicon with a thickness of from 40 nm to 150 nm by plasma CVD or sputtering. In this embodiment, a 100-nm-thick silicon nitride film is formed as the first interlayer insulating film 814 by plasma CVD. A well as the first interlayer insulating film, a second interlayer insulating film 815 is formed for covering the entire surface. As the second interlayer insulating film 815, a 1.6-µm-thick acrylic film is formed by coating in this embodiment. Further, a 0.1-µm-thick silicon nitride film is formed as a third interlayer insulating film 816.

Figure 7C:
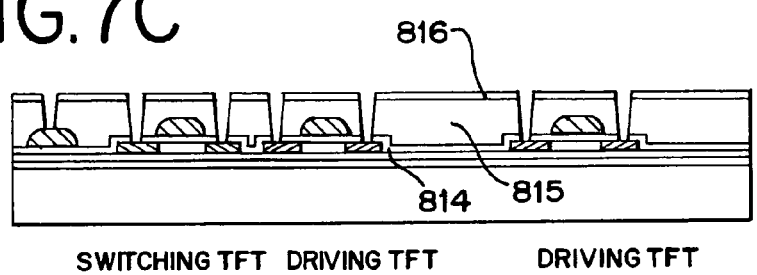

Subsequently, resist patterns for forming contact holes are formed by droplet discharging method in the same manner as the above-described case. The contact holes are formed by anisotropic dry etching while using the resist patterns as masks (FIG. 7C).

Next, second conductive layers (source wirings, and drain wirings) 817 to 822 are formed so as to extend to the bottom of the contact holes. In this embodiment, wiring patterns are formed by jetting a liquid in which fine particles of silver and aluminum are dispersed in an organic solvent by using a surfactant, for the second conductive layers. With respect to the fine particles of silver and aluminum, the composition ratio of aluminum is preferably set to from approximately 40 atoms % to 80 atoms % to silver. In addition, aluminum, an alloy of aluminum and germanium, an alloy of silver and germanium, an alloy of silver and tin, and the like may be used as substitute for the alloy of silver and aluminum. The materials for the composition jetted from the ink-jet nozzle can be arbitrarily selected by those who execute the present invention.

There is a possibility that unevenness reflecting the shape of the contact holes is generated, nonuniformity in the shape of wirings is caused depending on the condition of drying the organic solvent, the contact holes are not filled completely, and the like, which results in the defects of the wiring patterns.

Figure 7D:
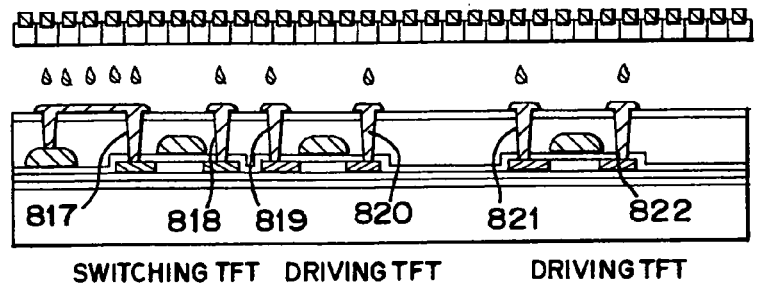

In order to overcome the defects, a heat treatment is subsequently carried out. The heat treatment may be performed by RTA, GRTA, laser irradiation, lamp annealing, and the like. Since the wirings are made of the alloy of Ag and Al in the embodiment, the wirings are reflowed by immediately heating the wirings at a temperature of from 500° C. to 600° C. Accordingly, the unevenness reflecting the shape of the contact holes and the nonuniformity of the shape of the wirings due to the process of drying the organic solvent can be modified. Such unevenness and nonuniformity of the shape of the wirings can be repaired even if the composition is not sufficiently filled in the contact holes. According to the forgoing processes, a transistor can be formed over the substrate 801 having an insulating surface. A cross sectional view at this moment is depicted in FIG. 7D.

Figure 8A:
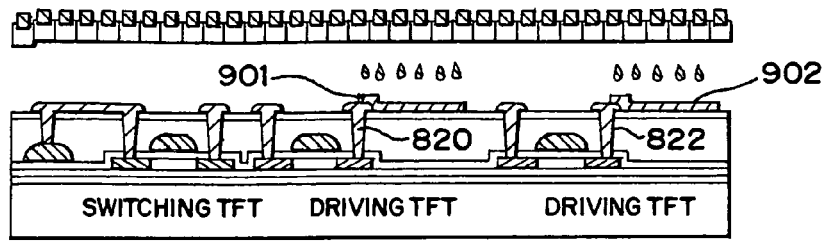
FIGS. 8A to 8D are diagrams according to Embodiment 2.

Then, pixel electrodes 901 and 902 made of a transparent conductor is formed over the entire surface so that they are electrically connected to the second conductive layers 820 and 822. For example, the pixel electrodes 901 and 902 can be made of a compound of indium oxide and tin oxide (ITO), a compound of indium oxide and zinc oxide, zinc oxide, tin oxide, indium oxide, titanium nitride and the like. In this embodiment, ITO films are formed to have a thickness of 0.1 µm by droplet discharging method as the pixel electrodes (FIG. 8A).

Figure 8B:
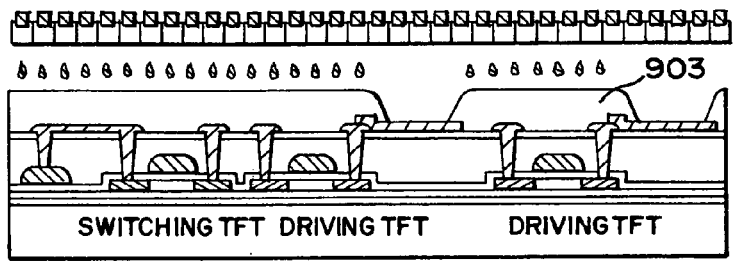
Figure 8C:
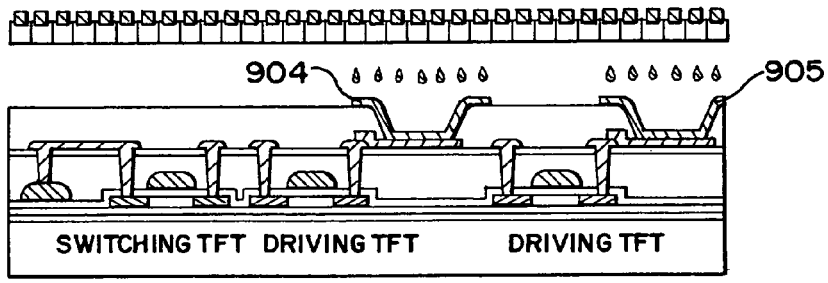
Figure 8D:
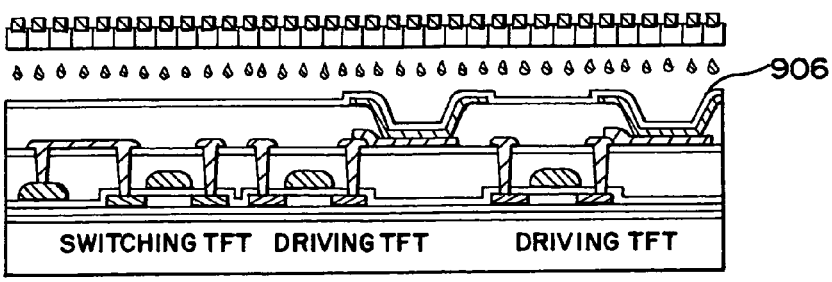

Thereafter, a formation step of a light-emitting element of an organic EL is performed. An insulating film 903 is formed to cover end faces of the pixel electrodes 901 and 902. The material for forming the insulating film 903 is not particularly limited, and can be formed from an inorganic material or an organic material (FIG. 8B). Subsequently, a region including an organic EL to be a light emitting layer is formed. Light emitting layers 904 and 905 are sequentially formed so as to be in contact with the pixel electrodes 901 and 902 under reduced pressure or in vacuum (FIG. 8C). The material for the light emitting layers 904 and 905 is not limited particularly. However, in the case of a full-color display, materials for red, green, blue are used, respectively. In addition, a second pixel electrode (cathode) 906 is formed by vapor deposition under reduced pressure or in vacuum (FIG. 8D).

The second pixel electrode (cathode) 906 is formed by laminating a thin film including a metal which has a small work function (such as lithium (Li), magnesium (Mg), cesium (Cs)), and a transparent conductive film laminated over a thin film including Li, Mg, etc. The film thickness of the second pixel electrode may be set appropriately so that the second pixel electrode can serve as a cathode, preferably, about from 0.01 µm to 1.0 µm in thickness. In this embodiment, an alloy film of aluminum and lithium (Al—Li) is formed to a thickness of 0.1 µm. Note that, the second pixel electrode 906 is formed over the entire surface.

A metal film generally used for the cathode is a metal film that includes an element belonging to Group 1 or 2 in the periodic table. Desirably, the surface of the metal film is protected since the metal film is easily oxidized. And since a thin metal film is necessary to be used as the cathode, it is preferable that resistance of the cathode is reduced and the cathode is protected by supplementarily providing a conductive film having lower resistance. A metal film mainly containing aluminum, copper, or silver as its main constituent is used as the conductive film having lower resistance.

The formation of the light emitting layers 904 and 905 and the second pixel electrode 906 can be formed by changing the kinds of the composition discharged from the inkjet head 807, or replacing the inkjet head 807 in which the composition is filled. In this case, such replacement can be carried out with exposing to the atmospheric air, thereby improving the reliability of the light emitting element which is sensitive to moisture and the like.

The portion composed by laminating the first pixel electrodes 901, 902, the light emitting layers 904, 905, and the second pixel electrode 906, which are formed in the above-mentioned process, corresponds to the light emitting element. The first pixel electrodes 901 and 902 function as anodes, whereas the second pixel electrode 906 functions as a cathode. Although the excited state of the light emitting element includes a singlet excited state and a triplet excited state, the light emitting element may emits light through any one of the excited states.

In this embodiment, a case of performing a bottom emission in which light generated in the light emitting element passes through the substrate 801 side (the bottom side) is shown. However, a top emission for transmitting light upwardly from the substrate 801 may be performed. In the case of the top emission, the first pixel electrodes 901 and 902 may be formed as the cathodes and the second pixel electrode 906 may be formed as an anode. The second pixel electrode 906 may be formed of a transparent material. Further, a driving TFT is preferably formed of an n-channel TFT. Note that, the conductivity type of the driving TFT may be changed appropriately, but a capacitor element is arranged so as to keep voltage between a gate and a source of the driving TFT. In this embodiment, the display device using a light emitting element is shown as an example. However, the present invention may be applied to a liquid crystal display device using a liquid crystal element or other display devices.

With respect to a portion where is necessary to be highly integrated such as a driving circuit portion, when the wiring is partially manufactured by combining Embodiment 2 with Embodiment Mode 3 or Embodiment Mode 4, the reliability of the liquid crystal display device can be further improved. Of course, the wiring can be entirely formed by combining Embodiment 1 with Embodiment Mode 3 or Embodiment Mode 4.

The present invention having the above structures can be applied to a large-size substrate, and can provide a method of manufacturing a wiring, a conductive layer, and a display device with higher reliability in addition to enhancing the throughput or usability of materials.

Embodiment 3

Figure 17A:
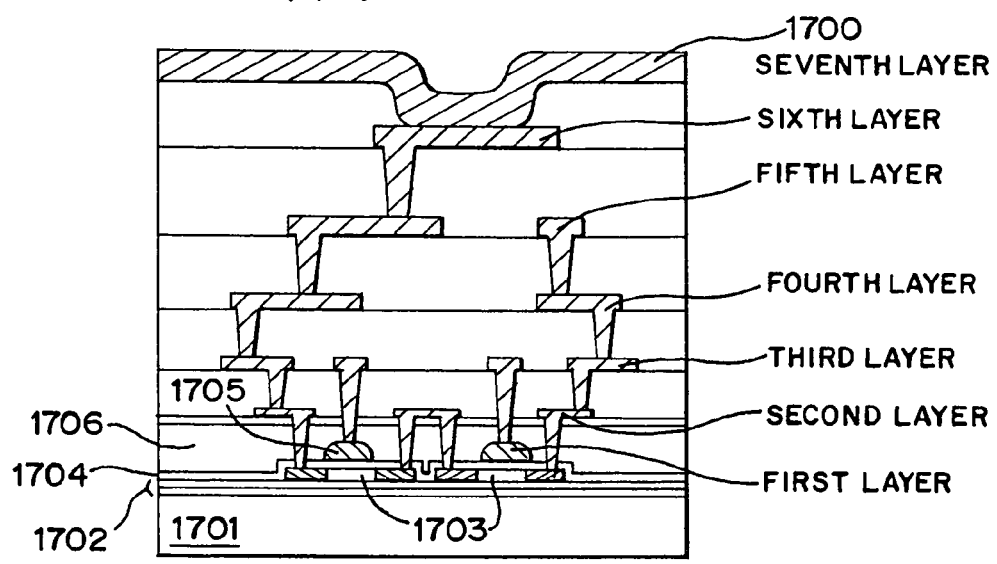
FIGS. 17A and 17B are diagrams showing an example of a formation of a multilayer wiring.
Figure 17A:
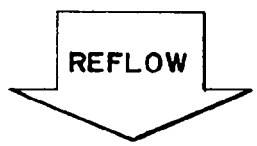
Figure 17B:
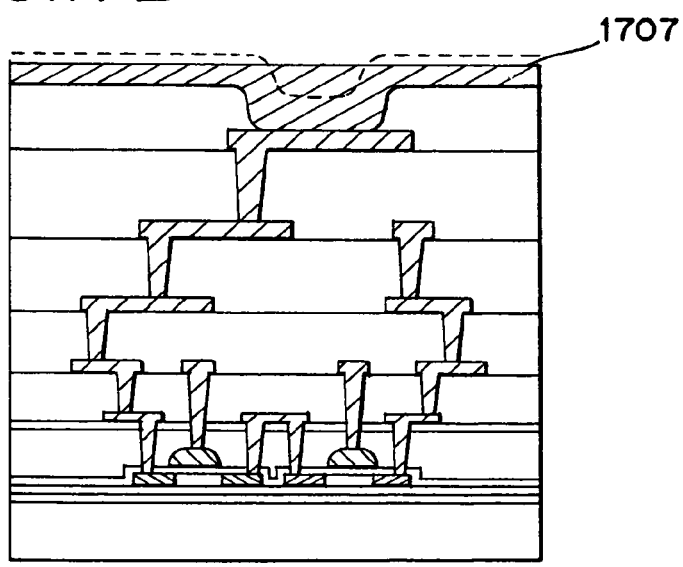

In Embodiment 3, still another embodiment of the present invention will be further described with reference to FIGS. 17A and 17B. FIGS. 17A and 17B show an example of forming a multilayer wiring which is effective in the case of manufacturing a higher integrated circuit such as CPU.

In this embodiment, only a wiring 1700, which is a top layer, i.e., seventh layer of the multilayer wiring, is formed by droplet discharging method, whereas the other wirings from the first layer to the sixth layer are formed by conventional photolithography while using a photosensitive resist as a mask. In order to form the wirings with precision, films may be conventionally formed by sputtering, wiring patterns may be formed by etching via a photolithography process, and only wiring patterns of upper layers of the multilayer wiring, which are relatively thicker than the wiring patterns of the lower layers, may be formed by droplet discharging method. The present embodiment shows an example in which only a top layer is formed by droplet discharging method.

FIGS. 17A and 17B show schematic views of cross section of a small portion of an integrated circuit. Note that the present invention is not limited to this structure unless a structure of the integrated circuit deviates from the scope of the present invention. It is of course that the number of the laminated layers is not limited to the present embodiment.

Semiconductor layers 1703 are formed over a substrate 1701 on which a base insulating film 1702 is formed. Gate electrodes 1705 are formed as the wirings for the first layer on a gate insulating film 1704, which is formed over the semiconductor layers 1703. An interlayer insulating film 1706 is made of a material such as silicon oxide, acrylic, and polyimide. The interlayer insulating film 1706 is etched by using a mask, which is manufactured by exposing and developing a photosensitive resist, and therefore contact holes are formed.

Subsequently, wirings for the second layer are formed so as to be in contact with impurity regions of the semiconductor layers. The wirings are usually formed of a material such as aluminum, titanium, an alloy of aluminum and titanium, and a lamination layer thereof. In this embodiment, the wirings are made of an alloy of aluminum and germanium. Since the wirings are made of the alloy of aluminum and germanium, the surface of the wirings can be leveled by carrying out a reflow process.

After the formation of the wirings for the second layer, the wirings for the second layer is reflowed by instantaneously applying heat at a temperature of not less than the softening point of the wirings to the wirings for the second layer. Although specific heat temperature is changed according to the ratio of the alloy of aluminum and germanium used for the wirings, it is set to in a range of from about 250° C. to 400° C. By performing the reflow process, the surface of the wirings is preferably planarized, and contact defects can be improved, thereby enhancing the reliability greatly.

Next, another interlayer insulating film is formed on the wirings for the second layer again, and then wirings for the third layer are formed in a same manner as the wirings for the second layer. Preferably, the wirings for the third layer are also made of the alloy of aluminum and germanium, and the reflow process is performed.

Subsequently, interlayer insulating films and wirings are alternately laminated on the wirings for the third layer in a similar fashion above, and then a wiring 1700, which is a top layer of the multilayer wiring, is formed by droplet discharging method (FIG. 17A). As a composition discharged to the wiring 1700, a liquid, in which fine particles of an alloy of silver and aluminum are dispersed into an organic solvent by using a dispersing agent, is used. Thus obtained wiring 1700 is instantaneously heated at temperatures of from 500° C. to 600° C. by using a laser, a lamp, and the like so as to perform the reflow process. At this moment, since the wiring 1700 is instantaneously heated, the wiring 1700 is reflowed under a thermal nonequilibrium state, and therefore heat hardly travels through the underlying wirings. As a result, the wiring 1700 is reflowed such that the surface of the wiring 1700 is leveled as well as a wiring 1707 in FIG. 17B.

According to the embodiment, the wirings having a leveled surface with superior reliability can be manufactured even if an integrated circuit having a multilayer structure is formed by sequentially laminating layers and performing the reflow process.

Furthermore, in recent years, a transfer printing technique has been researched as a method for forming elements on a plastic substrate and the like. When a multilayer wiring, which is superior in surface flatness, is manufactured according to the present invention, the multilayer wiring can be applied to the transfer printing technique.

The transfer printing technique is a technique in which an element is normally formed on a glass substrate and the like, and thus formed element is adhered to a supporting body such that the element is separated from the glass substrate. At this moment, in the case where the surface of the element is not leveled, the element is not well-adhered to the supporting medium, thereby causing defects in which the element is not properly separated from the glass substrate, for example. According to the present invention, however, it can be expected that the flatness of the surface of the element is improved, and generation of such defects is suppressed.

Embodiment 4

In this embodiment, an example of applying the present invention to a bottom gate TFT, which is a channel etching type, will be described with reference to FIGS. 9A to 9D.

Figure 9A:
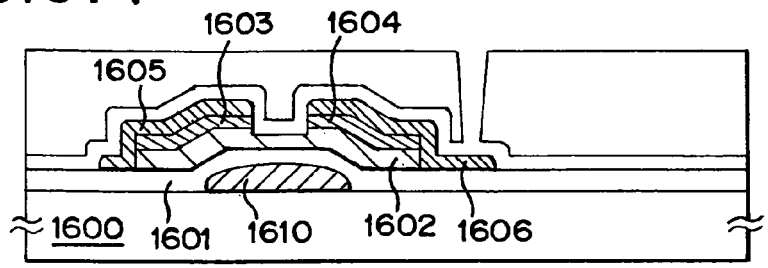
FIGS. 9A to 9D are diagrams according to Embodiment 4.

A gate electrode 1610 is formed of Ta, Cr, Mo, Al or the like over a substrate 1600. A gate insulating film 1601 is made of a silicon nitride film, a silicon oxide film, a tantalum oxide film, or the like over the substrate 1600. A semiconductor film 1602 having an amorphous structure is formed thereon so as to partly overlap the gate electrode 1610. The semiconductor film 1602 having the amorphous structure is typically formed of amorphous silicon to a thickness of from 100 nm to 250 nm by plasma CVD. A semiconductor layer doped with an n-type or p-type conductivity is formed so as to overlap the semiconductor film 1602 having the amorphous structure. The semiconductor film 1602 having the amorphous structure and the semiconductor layer are processed into an island shape, and then a film made of Cr, Ti, Ta, etc. is formed over the island-like semiconductor layer. The film is further patterned so as to be source/drain electrodes 1605 and 1606. By using the source/drain electrodes 1605 and 1606 as masks, the semiconductor layer doped with the n-type or p-type conductivity is etched and divided into two regions 1603 and 1604. Since the foregoing etching treatment cannot be performed selectively, the semiconductor film 1602 having the amorphous structure is also partly etched and removed. Thereafter, an insulating film is formed thereon, and a contact hole is formed so as to be in contact with the source/drain electrodes 1605 and 1606 (FIG. 9A).

Figure 9B:
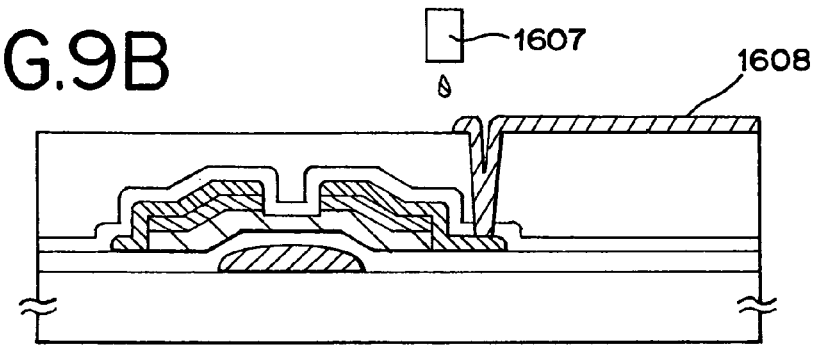

A wiring 1608 is formed by droplet discharging method so as to be connected to the source/drain electrode 1606 via the contact hole. As a composition of a liquid droplet that is jetted from an inkjet nozzle 1607, a solution in which fine particles of an alloy of silver and aluminum are dispersed among an organic solvent by using a discharging agent is preferably used (FIG. 9B).

Figure 9C:
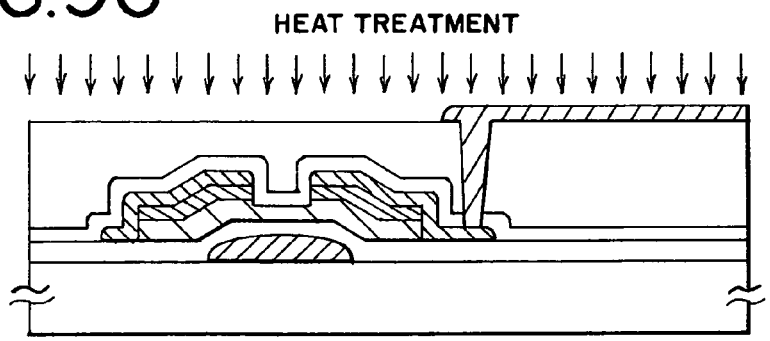
Figure 9D:
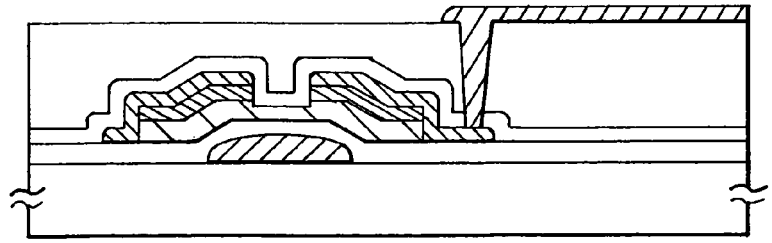

Thus obtained wiring is instantaneously heated at temperatures of from 500° C. to 600° C. by using a laser, a lamp, and the like so as to carry out a reflow process (FIG. 9C). At this time, since the wiring is reflowed under a thermal nonequilibrium state by heating instantaneously, heat hardly travels through the underlying wirings. Even if the surface of the wiring 1608 is not leveled and contact defects are generated on the wiring, such defects can be reduced by performing the reflow process. As a result, products with higher reliability can be provided at a lower cost while eliminating the waste of the materials (FIG. 9D).

Embodiment 5

Figure 10A:
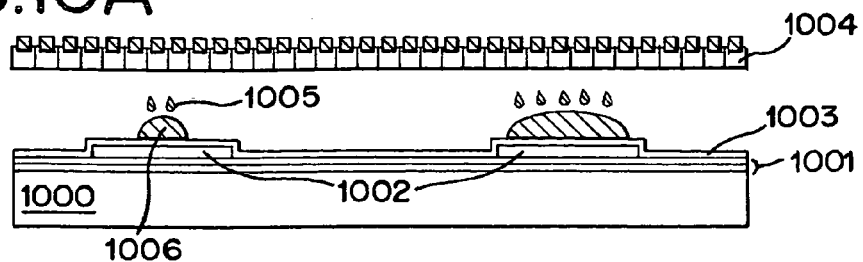
FIGS. 10A to 10E are diagrams according to Embodiment 5.
Figure 10B:
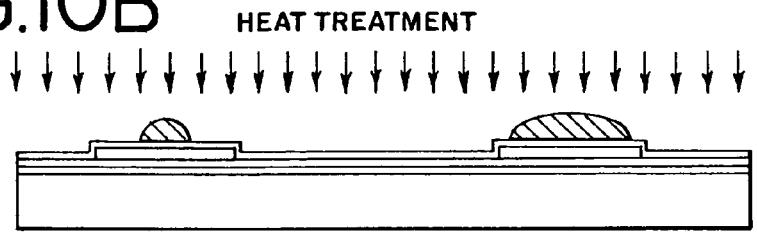

In order to level unevenness or projections of a surface of a conductive layer or an insulating film formed by droplet discharging method, a method as described in FIGS. 10A to 10E can be proposed. A base insulating film 1001, a semiconductor layer 1002, and a gate insulating film 1003 are formed on a substrate 1000. Subsequently, a liquid droplet 1005 containing a conductive composition is dropped from a nozzle 1004 by droplet discharging method to form a conductive layer 1006 (FIG. 10A).

Figure 10C:
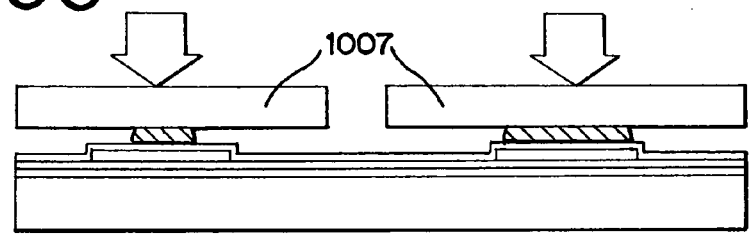
Figure 10D:
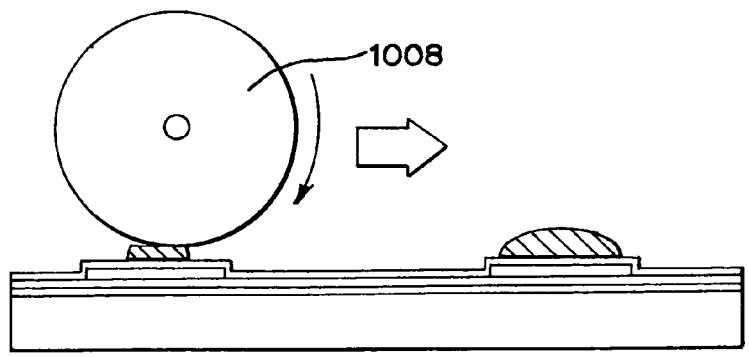
Figure 10E:
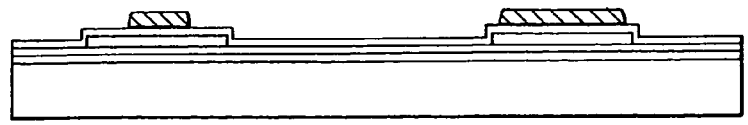

After the conductive layer thus obtained is heated (FIG. 10B), the conductive layer is pressed by means of a substrates 1007 which is coated with Teflon (registered trademark) etc., a roller 1008 and the like (FIGS. 10C and 10D). Therefore, the surface of the conductive layer and the insulating film on which unevenness is minutely formed is planarized (FIG. 10E). Meanwhile, buff polishing, electrolytic polishing, composite electrolytic polishing, and the like may be employed as substitutes for the press treatment.

Embodiment 6

Figure 13:
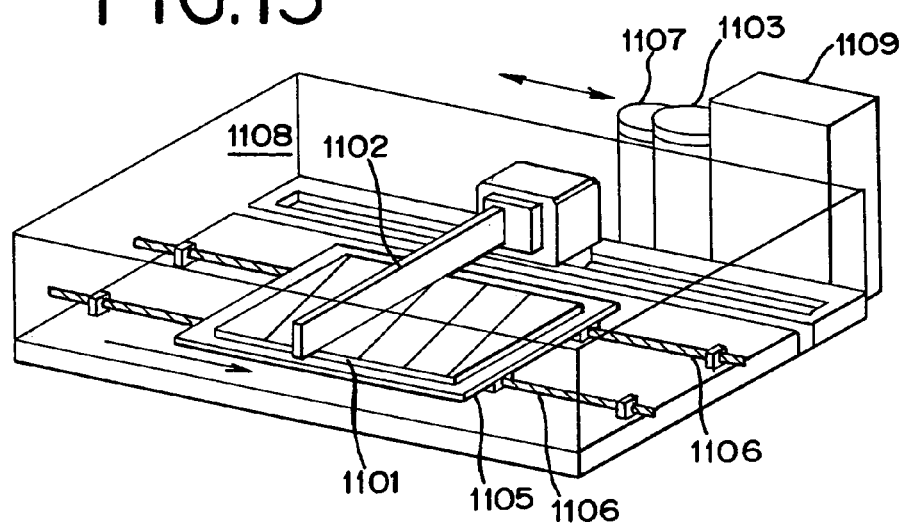
FIG. 13 is a diagram showing an apparatus used for the present invention.

FIG. 13 is an example showing an apparatus for forming wirings and the like by droplet discharging method. The apparatus comprises: a means 1106 for accurately transferring a substrate 1101 in a y-axis direction while fixing the substrate by a mechanical chuck etc.; a means 1107 for supplying a composition to an ink-jet head 1102; a vacuum evacuation means 1103 for evacuating a processing chamber, and the like.

The vacuum evacuation means 1103 can evacuate air from an interior of a chamber, and can maintains the interior of the chamber in high vacuum. In the chamber, the inkjet head 1102 is a means for jetting microscopic liquid droplets which contain a material for forming desired patterns on the substrate 1101, and comprises a plurality of nozzles. The position of the inkjet head 1102 can be adjusted minutely. On the other hand, the substrate 1101 can be moved in a y-axis direction. By minutely adjusting a cycle of jetting the liquid droplets from the inkjet head 1102, the moving distance of the substrate 1101, and the position of the inkjet head 1102 at the same time so as to form a continuous wiring pattern over the substrate, a variety of patterns can be formed over the substrate.

Other accompanying constituents such as a conveyor means for carrying in/out the substrate to be processed from a substrate holding means 1105, and a clean unit for reducing dust in a work region by sending out clean air may be provided.

With respect to the vacuum evacuation means 1103, a turbo-molecular pump, a mechanical booster pump, a rotary oil pump, or a cryo-pump can be used for the evacuation pumps. Desirably, above-mentioned pumps are arbitrarily combined for the vacuum evacuation means.

In the present invention, the pattern formation of the wirings, the conductive films or the resist materials is performed in a processing chamber 1108 for inkjetting. Preferably, the amount of the composition jetted once from the inkjet head 1102 is from 10 pl to 70 pl, the viscosity is 100 cp or less, and the grain size is 0.1 μm or less. This is because the viscosity is too high to apply the composition smoothly from an inkjet nozzle. And the above conditions can prevent the composition from drying out. Thus, the viscosity, the surface tension, the drying rate and the like of the composition are properly adjusted in accordance with the solvent to be used and intended purpose. The composition discharged from the inkjet head is preferably formed in a linear shape or a stripe shape by consecutively dropping the composition on the substrate. However, the composition may be dropped onto the predetermined spots, per dot, for example. In the processing chamber 1108 for inkjetting, the substrate holding means 1105, the inkjet head 1102, and the like are provided.

Although not shown in FIG. 13, the apparatus in this embodiment may be provided with a sensor for aligning the portion of the substrate 1101 or the patterns on the substrate, a means for introducing gas into the processing chamber 1108 for ink-jetting, a means for evacuating the interior of the processing chamber 1108 for ink-jetting, a means for heating the substrate, a means for irradiating light to the substrate, a means for measuring various properties of materials such as temperature, pressure, and the like, if necessary. Further, the all means can be controlled by a controlling means 1109 provided in the outside of the processing chamber 1108 for ink-jetting. Furthermore, when the controlling means 1109 is connected to a production management system etc. by LAN cable, wireless LAN, optical fiber and the like, the all process can be externally controlled, thereby improving the productivity.

The present invention can be implemented by variously applying and freely combining the means of the embodiment. Note that as a material used for inkjetting, a material, which can be liquefied by dissolving in a solvent or heating and can be jetted as a liquid droplet, may be used. For example, following materials can be used according to the intended use: a conductive material to be a wiring; a resist material; a resin material to be an orientation film; a luminescent material used for a light emitting element; an etching solution used for wet etching, and the like.

Meanwhile, as a substrate used in the present invention, a resin substrate typified by a plastic substrate, a processed substance such as a semiconductor wafer typified by silicon, and the like can be employed in addition to the glass substrate of predetermined size. Furthermore, either of a substrate with a leveled surface or a substrate on which uneven patterns are formed may be used as the substrate used in the present invention. The surface of the substrate may arbitrarily be imparted with hydrophilic property or hydrophobic property within the application range, or the surface of the substrate is not imparted therewith.

Figure 14:
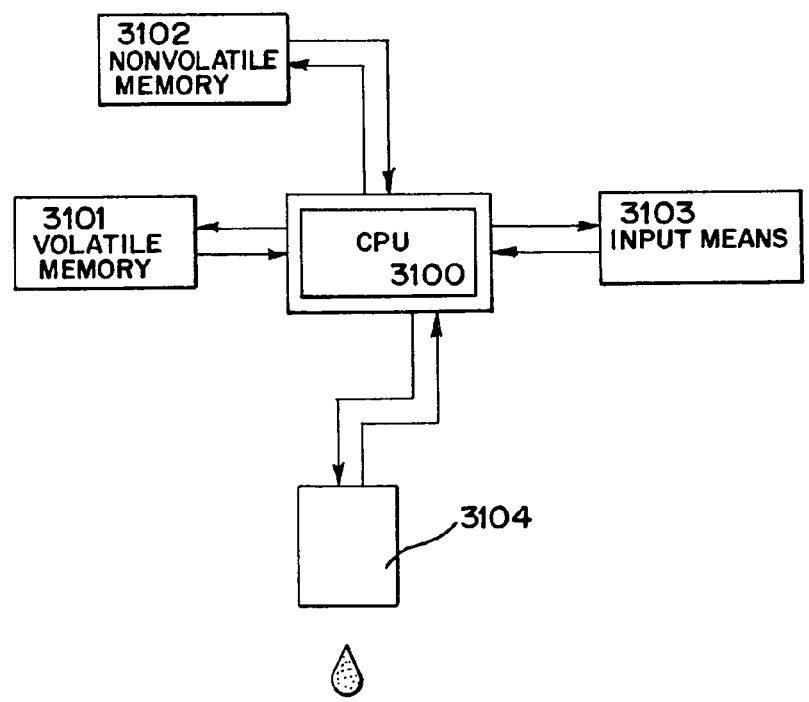
FIG. 14 is a block diagram relating to a computerized control.

When the controlling means 1109 is connected to a personal computer and the like, an inputted circuit wiring can be immediately manufactured. This operation system will be simply described with reference to FIG. 14.

A droplet discharging method apparatus comprising a CPU 3100, a volatile memory 3101, nonvolatile memory 3102, a input means 3103 such as a keyboard and operational buttons, a liquid droplet discharging method means 3104, and the like can be cited as main components for the system. To explain the operation of the droplet discharging method apparatus briefly, when data of the circuit wiring is input by the input means 3103, the data is memorized in the volatile memory 3101 or the nonvolatile memory 3102 via the CPU 3100. A liquid droplet composition is selectively discharged by the liquid droplet discharging method means 3104 in accordance with the memorized data, and therefore wirings can be formed.

According to the foregoing constitution, a mask for exposing is dispensable, thereby reducing the process for exposing, developing, and the like drastically. As a result, the throughput is enhanced, and hence, the productivity can be significantly improved. The constitution of the embodiment may be utilized for the purpose of repairing disconnection of a wiring, electrical contact failure between a wiring and an electrode. In this case, for example, data about a portion where is necessary to be repaired is preferably input to a personal computer etc. such that a liquid droplet composition is discharged to the portion where is necessary to be repaired from a nozzle. In addition, a wiring can be easily formed on a large size substrate of which side exceeds 1.0 m. Since only the quantity of materials needed is applied to a desired portion, waste materials are hardly generated, thereby improving the usability of the materials and reducing the manufacturing costs.

Embodiment 7

Given as examples of electric appliances manufactured by using the present invention: a video camera, a digital camera, a goggles-type display (head mounted display), a navigation system, a sound reproduction device (a car audio equipment, an audio set and the like), a laptop personal computer, a game machine, a portable information terminal (such as a mobile computer, a cellular phone, a portable game machine, and an electronic book), an image reproduction device equipped with a recording medium (more specifically, a device which can reproduce a recording medium such as a digital versatile disc (DVD) and so forth, and includes a display for displaying the reproduced image), and the like. FIGS. 15A to 15E and FIG. 16A to 16D show various specific examples of such electric appliances.

Figure 15A:
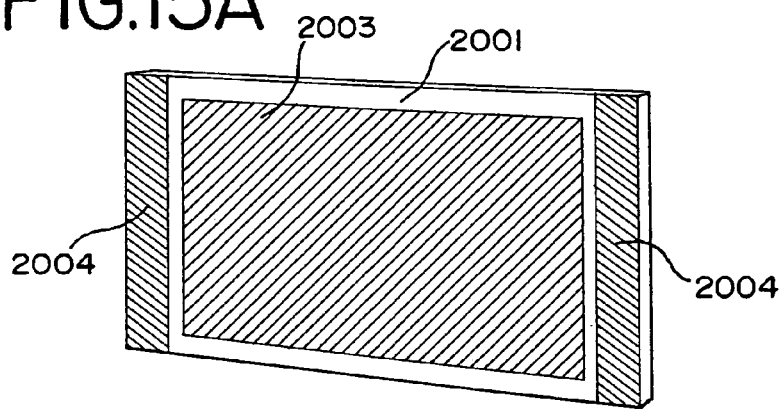
FIGS. 15A to 15E are diagrams showing examples of electronic appliances to which the present invention can be applied.

FIG. 15A illustrates a display device which includes a casing 2001, a support table 2002, a display portion 2003, speaker portions 2004 and the like. The display device according to the invention can be used for the display portion 2003. More specifically, the display device according to the present invention is preferably applied to a display device with a larger screen of from 20 inches to 80 inches.

Figure 15B:
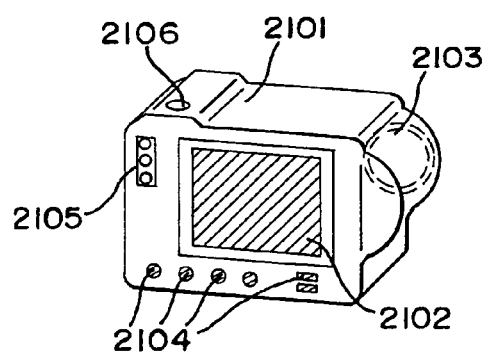

FIG. 15B illustrates a digital still camera which includes a main body 2101, a display portion 2102, an image receiving portion 2103, operation keys 2104, an external connection port 2105, a shutter 2106 and the like. The display device of the invention can be applied to the display portion 2102.

Figure 15C:
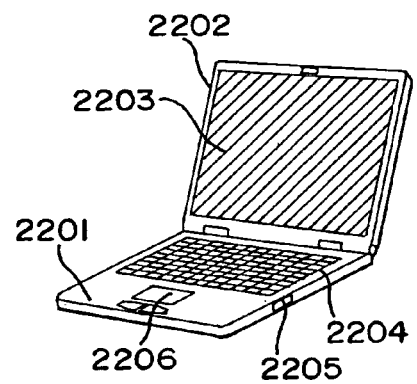

FIG. 15C illustrates a laptop computer which includes a main body 2201, a casing 2202, a display portion 2203, a keyboard 2204, an external connection port 2205, a pointing mouse 2206, and the like. The display device according to the invention can be applied to the display portion 2203.

Figure 15D:
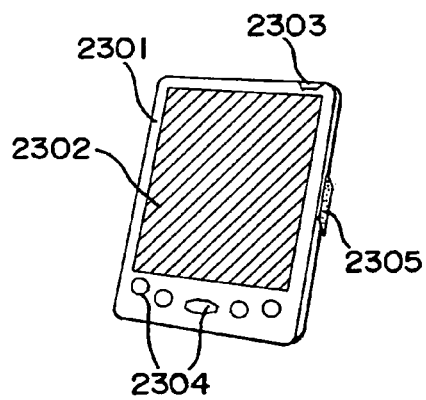

FIG. 15D illustrates a mobile computer which includes a main body 2301, a display portion 2302, a switch 2303, operation keys 2304, an infrared port 2305, and the like. The display device according to the invention can be used to the display portion 2302.

Figure 15E:
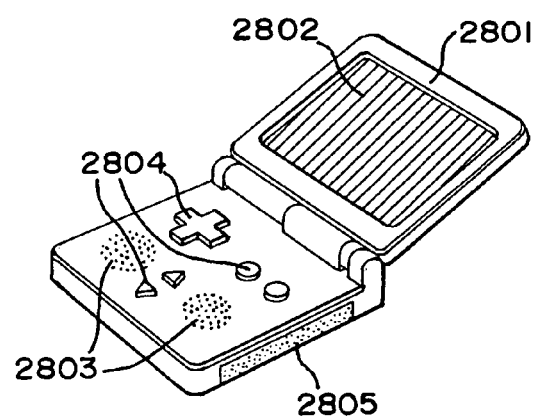

FIG. 15E illustrates a portable game machine which includes a casing 2801, a display portion 2802, speaker portions 2803, operation keys 2804, recording medium inserting portion 2805, and the like. The display device according to the present invention can be applied to the display portion 2802.

Figure 16A:
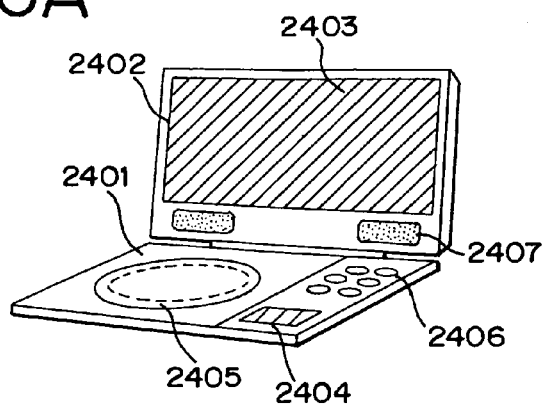
FIGS. 16A to 16D are diagrams showing examples of electronic appliances to which the present invention can be applied.

FIG. 16A illustrates an image reproduction device equipped with a recording medium (more specifically, a DVD reproduction device), which includes a main body 2401, a casing 2402, a display portion A 2403, another display portion B 2404, a recording medium (such as DVD) reading portion 2405, operation keys 2406, a speaker portion 2407, and the like. The display portion A 2403 mainly displays image information, while the display portion B 2404 mainly displays character information. The display device according to the invention can be applied to the display potion A 2403 and the display portion B 2404. Note that the image reproduction device with a recording medium further includes a domestic game machine and the like.

Figure 16B:
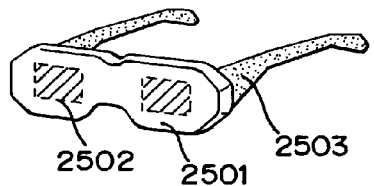

FIG. 16B illustrates a goggle type display (head mounted display), which includes a main body 2501, a display portion 2502, and an arm portion 2503. The display device according to the invention can be applied to the display portion 2502.

Figure 16C:
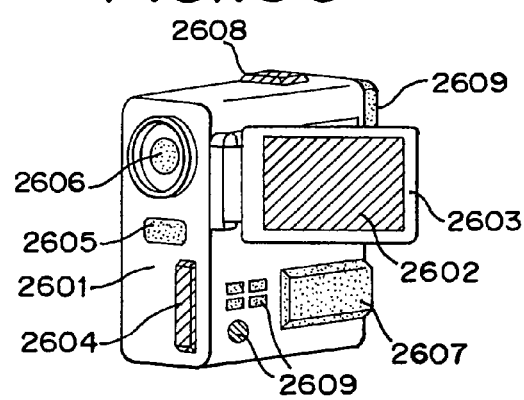

FIG. 16C illustrates a video camera which includes a main body 2601, a display portion 2602, a casing 2603, an external connecting port 2604, a remote control receiving portion 2605, an image receiving portion 2606, a battery 2607, a sound input portion 2608, operation keys 2609, an eyepiece potion 2610, and the like. The display device according to the invention can be applied to the display portion 2602.

Figure 16D:
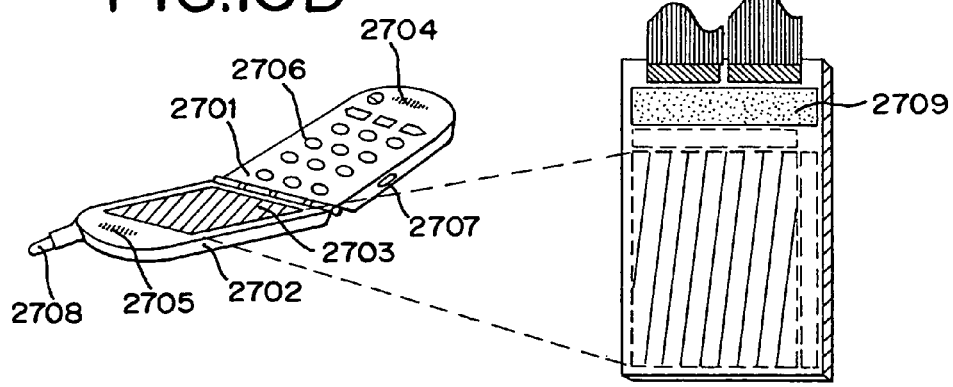

FIG. 16D illustrates a cellular phone which includes a main body 2701, a casing 2702, a display portion 2703, a sound input portion 2704, a sound output portion 2705, operation keys 2706, an external connecting port 2707, an antenna 2708, and the like. The display device according to the invention can be applied to the display portion 2703 and a CPU 2709. The CPU 2709 having a multilayered structure is simultaneously formed on a panel. In particular, the present invention is preferably applied to the CPU 2709.

As set forth above, the present invention can be widely applied to electric appliances in various fields. In addition, wiring defects can be reduced according to the present invention, and hence, price reduction can be realized. Furthermore, since the reliability of the products is improved, the reliability of the manufacture can also be increased.

What is claimed is:

1. A method of manufacturing a semiconductor device comprising steps of:
    forming an insulating film over a substrate;
    forming an opening in the insulating film;
    dropping a liquid droplet containing a conductive composition by droplet discharging method over the substrate, thereby a wiring is formed on a position including at least the opening; and
    performing a heat treatment at a temperature of not less than the softening point of the conductive composition, thereby a surface of the wiring on the opening and a surface of the wiring other than the wiring on the opening are approximately leveled over the substrate.

2. A method according to claim 1, further comprising steps of:
    after the heat treatment, forming a mask on the wiring; and
    etching the wiring by using the mask.

3. A method according to claim 2, wherein the mask is formed by droplet discharging method.

4. A method according to claim 1, further comprising a step of:
    forming a partition wall over the substrate prior to dropping the liquid droplet, thereby the wiring formed by droplet discharging method is formed inside of the partition wall.

5. A method according to claim 4, wherein the partition wall is manufactured by droplet discharging method.

6. A method according to claim 1, wherein the droplet discharging method is carried our under reduced pressure.

7. A method according to claim 1, wherein the heat treatment is performed by using a lamp.

8. A method according to claim 1, wherein the heat treatment is performed by irradiating laser beam.

9. A method according to claim 1, wherein the conductive composition is formed by dispersing a material containing a plurality of nanometal particles in a solvent.

10. A method according to claim 1, wherein the semiconductor device is a display device.

11. A method of manufacturing a semiconductor device comprising steps of:
    forming an insulating film over a substrate;
    forming an opening in the insulating film;
    dropping a liquid droplet containing a conductive composition by droplet discharging method over the substrate, thereby a wiring is formed on a position including at least the opening; and
    performing a heat treatment at a temperature of not less than the softening point of the conductive composition, thereby the opening is filled with the wiring.

12. A method according to claim 11, further comprising steps of:
    after the heat treatment, forming a mask on the wiring; and
    etching the wiring by using the mask.

13. A method according to claim 12, wherein the mask is formed by droplet discharging method.

14. A method according to claim 11, further comprising a step of:
    forming a partition wall over the substrate prior to dropping the liquid droplet, thereby the wiring formed by droplet discharging method is formed inside of the partition wall.

15. A method according to claim 14, wherein the partition wall is manufactured by droplet discharging method.

16. A method according to claim 11, wherein the droplet discharging method is carried our under reduced pressure.

17. A method according to claim 11, wherein the heat treatment is performed by using a lamp.

18. A method according to claim 11, wherein the heat treatment is performed by irradiating laser beam.

19. A method according to claim 11, wherein the conductive composition is formed by dispersing a material containing a plurality of nanometal particles in a solvent.

20. A method according to claim 11, wherein the semiconductor device is a display device.

21. A method of manufacturing a semiconductor device comprising steps of:
    forming an insulating film over a substrate;
    forming an opening in the insulating film;
    dropping a liquid droplet containing a conductive composition by droplet discharging method over the substrate, thereby a wiring is formed on a position including at least the opening; and
    performing a heat treatment at a temperature of not less than the softening point of the conductive composition, thereby a surface of the wiring on the opening and a surface of the wiring other than the wiring on the opening are approximately leveled over the substrate and the opening is filled with the wiring.

22. A method according to claim 21, further comprising steps of:
    after the heat treatment, forming a mask on the wiring; and
    etching the wiring by using the mask.

23. A method according to claim 22, wherein the mask is formed by droplet discharging method.

24. A method according to claim 21, further comprising a step of
    forming a partition wall over the substrate prior to dropping the liquid droplet, thereby the wiring formed by droplet discharging method is formed inside of the partition wall.

25. A method according to claim 24, wherein the partition wall is manufactured by droplet discharging method.

26. A method according to claim 21, wherein the droplet discharging method is carried our under reduced pressure.

27. A method according to claim 21, wherein the heat treatment is performed by using a lamp.

28. A method according to claim 21, wherein the heat treatment is performed by irradiating laser beam.

29. A method according to claim 21, wherein the conductive composition is formed by dispersing a material containing a plurality of nanometal particles in a solvent.

30. A method according to claim 21, wherein the semiconductor device is a display device.

31. A method of manufacturing a semiconductor device comprising steps of:
   forming a thin film transistor over a substrate;
   forming an insulating film over the thin film transistor;
   forming an opening in the insulating film;
   dropping a liquid droplet containing a conductive composition by droplet discharging method over the substrate, thereby a wiring is formed on a position including at least the opening and connected to the thin film transistor;
   performing a heat treatment at a temperature of not less than the softening point of the conductive composition; and
   forming a pixel electrode over the insulating film and the wiring, the pixel electrode connected to the wiring.

32. A method according to claim 31, wherein the pixel electrode is formed by droplet discharging method.

33. A method according to claim 31, further comprising steps of:
   after the heat treatment, forming a mask on the wiring; and
   etching the wiring by using the mask.

34. A method according to claim 33, wherein the mask is formed by droplet discharging method.

35. A method according to claim 31, further comprising a step of:
   forming a partition wall over the substrate prior to dropping the liquid droplet, thereby the wiring formed by droplet discharging method is formed inside of the partition wall.

36. The method according to claim 35, wherein the partition wall is manufactured by droplet discharging method.

37. A method according to claim 31, wherein the droplet discharging method is carried our under reduced pressure.

38. A method according to claim 31, wherein the heat treatment is performed by using a lamp.

39. A method according to claim 31, wherein the heat treatment is performed by irradiating laser beam.

40. A method according to claim 31, wherein the conductive composition is formed by dispersing a material containing a plurality of nanometal particles in a solvent.

41. A method according to claim 31, wherein after the heat treatment, a surface of the wiring on the opening and a surface of the wiring other than the wiring on the opening are approximately leveled over the substrate and the opening is filled with the wiring.

42. A method according to claim 31, wherein the semiconductor device is a display device.

* * * * *